(12) United States Patent
Matsuoka et al.

(10) Patent No.: US 7,978,552 B2
(45) Date of Patent: Jul. 12, 2011

(54) SEMICONDUCTOR MEMORY DEVICE

(75) Inventors: Fumiyoshi Matsuoka, Kawasaki (JP); Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 12/564,526

(22) Filed: Sep. 22, 2009

(65) Prior Publication Data
US 2010/0165770 A1 Jul. 1, 2010

(30) Foreign Application Priority Data
Dec. 26, 2008 (JP) ................................ 2008-334431

(51) Int. Cl.
*G11C 7/02* (2006.01)
(52) U.S. Cl. .............. 365/207; 365/189.04; 365/185.21; 365/230.06; 365/196; 365/189.15
(58) Field of Classification Search ............. 365/189.04, 365/207, 185.21, 230.06, 196, 189.15, 189.16
See application file for complete search history.

(56) References Cited

U.S. PATENT DOCUMENTS
| 6,621,725 | B2 | 9/2003 | Ohsawa | |
| 7,539,043 | B2 | 5/2009 | Ohsawa | |
| 2009/0273976 | A1* | 11/2009 | Maejima et al. | 365/185.05 |

FOREIGN PATENT DOCUMENTS
JP 2006-301377 11/2006
* cited by examiner

*Primary Examiner* — Thong Q Le
(74) *Attorney, Agent, or Firm* — Oblon, Spivak, McClelland, Maier & Neustadt, L.L.P.

(57) ABSTRACT

A memory includes memory cells, wherein during a first write operation in which first logical data is written in all memory cells connected to a first word line, a source line driver and a word line driver, the source line driver shifts a voltage of a selected source line corresponding to the first word line in a direction away from the voltage of the first word line and the word line driver shifts a voltage of a second word line in a same direction as a transition direction of voltage of a selected source line, and during a second write operation in which second logical data is written in a selected cell connected to the first word line, the source line driver and the word line driver shift voltages of the selected source line and the second word line in a direction approaching the voltage of the first word line.

19 Claims, 20 Drawing Sheets

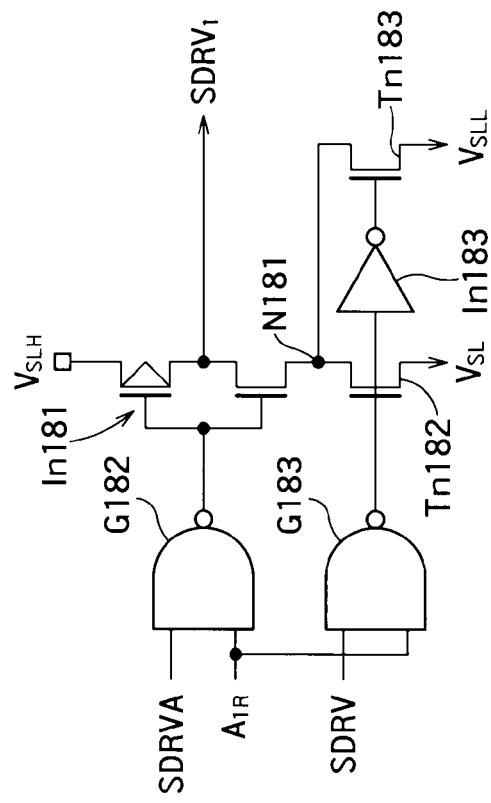
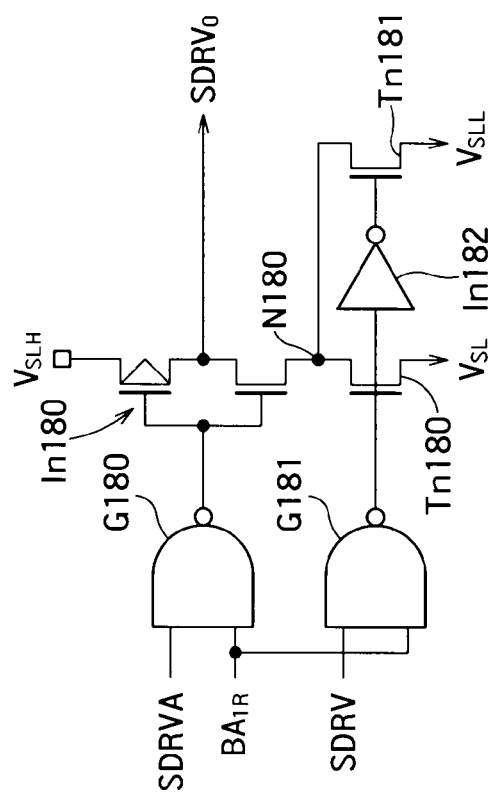
FIG. 13B
FIG. 13A

SEMICONDUCTOR MEMORY DEVICE

CROSS-REFERENCE TO RELATED APPLICATION

This application is based upon and claims the benefit of priority from the prior Japanese Patent Applications No. 2008-334431, filed on Dec. 26, 2008, the entire contents of which are incorporated herein by reference.

BACKGROUND OF THE INVENTION

1. Field of the Invention

The present invention relates to a semiconductor memory device.

2. Related Art

FBC (Floating Body Cell) memory devices are semiconductor memory devices expected recently as memories replacing 1T (Transistor)-1C (Capacitor) DRAMs. According to the FBC memory device, an FET (Field Effect Transistor) with a floating body (hereinafter, also body) is formed on an SOI (Silicon On Insulator) substrate, and data "1" or data "0" is stored depending on the number of majority carriers accumulated in the body. A state that a small number of holes (majority carriers) are accumulated in the body is indicated as the data "0". A state that a large number of holes are accumulated in the body is indicated as the data "1".

A technique for having two adjacent memory cells share a bit line contact or a source line contact in an FBC has been developed to downscale memory chips (see JP-A 2006-301377 (KOKAI)). In the memory described in JP-A 2006-301377 (KOKAI), to reduce disturb during data "0" write, a potential of an unselected word line connected to cells which share a source line with cells connected to a selected word line is made to be lower than potentials of other unselected word lines during the write operation.

When the data "1" is selectively written in memory cells, however, a high level potential is applied to a bit line in a selected column. Thus, data in "0" cells connected to the unselected word line sharing the source line with the selected word line and the bit line in the selected column may be subject to disturb by GIDL (Gate Induced Drain Leakage). This is because when the unselected word line sharing the source line with the selected word line has a low level potential and the bit line in the selected column has a high level potential, holes are easily accumulated in the body of the "0" cell.

SUMMARY OF THE INVENTION

A semiconductor memory device according to an embodiment of the present invention comprises: a plurality of bit lines; a plurality of word lines crossing the bit lines; a plurality of memory cells corresponding to intersections of the bit lines with the word lines, the memory cells being configured to store data depending on carriers stored in electrically floating bodies; a source line corresponding to first and second word lines adjacent to each other and connected to memory cells connected to the first and the second word lines; a plurality of sense amplifiers connected to the bit lines and configured to detect data stored in the memory cells or to write data in the memory cells; and a source line driver configured to drive the source line; and a word line driver configured to drive the first word line or the second word line, wherein during a first write operation in which first logical data is written in all memory cells connected to the first word line, the word line driver applies a voltage to the first word line in such a manner that channels are formed in the memory cells connected to the first word line, the source line driver shifts a voltage of a selected source line corresponding to the first word line in a direction away from the voltage of the first word line, and the word line driver shifts a voltage of the second word line in a same direction as a transition direction of voltage of the selected source line, and during a second write operation in which second logical data is written in a selected memory cell of the memory cells connected to the first word line, the source line driver and the word line driver respectively shift voltages of the selected source line and the second word line in a direction approaching the voltage of the first word line.

A semiconductor memory device according to an embodiment of the present invention comprises: a plurality of bit lines; a plurality of word lines crossing the bit lines; a plurality of memory cells corresponding to intersections of the bit lines with the word lines, the memory cells being configured to store data depending on carriers stored in electrically floating bodies; a source line corresponding to first and second word lines adjacent to each other and connected to memory cells connected to the first and the second word lines; a plurality of sense amplifiers connected to the bit lines and configured to detect data stored in the memory cells or to write data in the memory cells; and a source line driver configured to drive the source line; and a word line driver configured to drive the first word line or the second word line, wherein during a first write operation of writing first logical data in all memory cells connected to the first word line, the word line driver applies a voltage to the first word line in such a manner that channels are formed in the memory cells connected to the first word line, the source line driver shifts the voltage of the selected source line corresponding to the first word line in a direction opposite to a transition direction of voltage of the first word line, while the word line driver keeps the voltage of the second word line at the word line potential under the data holding state, and during a second write operation in which second logical data is written in a selected memory cell of the memory cells connected to the first word line, the source line driver and the word line driver respectively shift voltages of the selected source line and the second word line in a direction approaching the voltage of the first word line.

A semiconductor memory device according to an embodiment of the present invention comprises: a plurality of bit lines; a plurality of word lines crossing the bit lines; a plurality of memory cells corresponding to intersections of the bit lines with the word lines, the memory cells being configured to store data depending on carriers stored in electrically floating bodies; a source line corresponding to first and second word lines adjacent to each other and connected to memory cells connected to the first and the second word lines; a plurality of sense amplifiers connected to the bit lines and configured to detect data stored in the memory cells or to write data in the memory cells; and a source line driver configured to drive the source line; and a word line driver configured to drive the first word line or the second word line, wherein during a first write operation in which first logical data is written in all memory cells connected to the first word line, the word line driver applies a voltage to the first word line in such a manner that channels are formed in the memory cells connected to the first word line, the source line driver and the word line driver respectively shift a voltage of a selected source line corresponding to the first word line and a voltage of the second word line in a direction approaching the voltage of the first word line, and during a second write operation in which second logical data is written in a selected memory cell of the memory cells connected to the first word line, the word line driver shifts voltages of the second word line in a direction away from the voltage of the first word line, and the source line driver shifts a voltage of the selected source line in a same direction as a transition direction of voltage of the second word line.

BRIEF DESCRIPTION OF THE DRAWINGS

FIGS. 13A and 13B are circuit diagrams showing drive circuits for the source drive lines SDRV0 and SDRV1;

DETAILED DESCRIPTION OF THE INVENTION

Embodiments of the present invention will be explained below in detail with reference to the accompanying drawings. Note that the invention is not limited thereto.

First Embodiment

Figure 1:
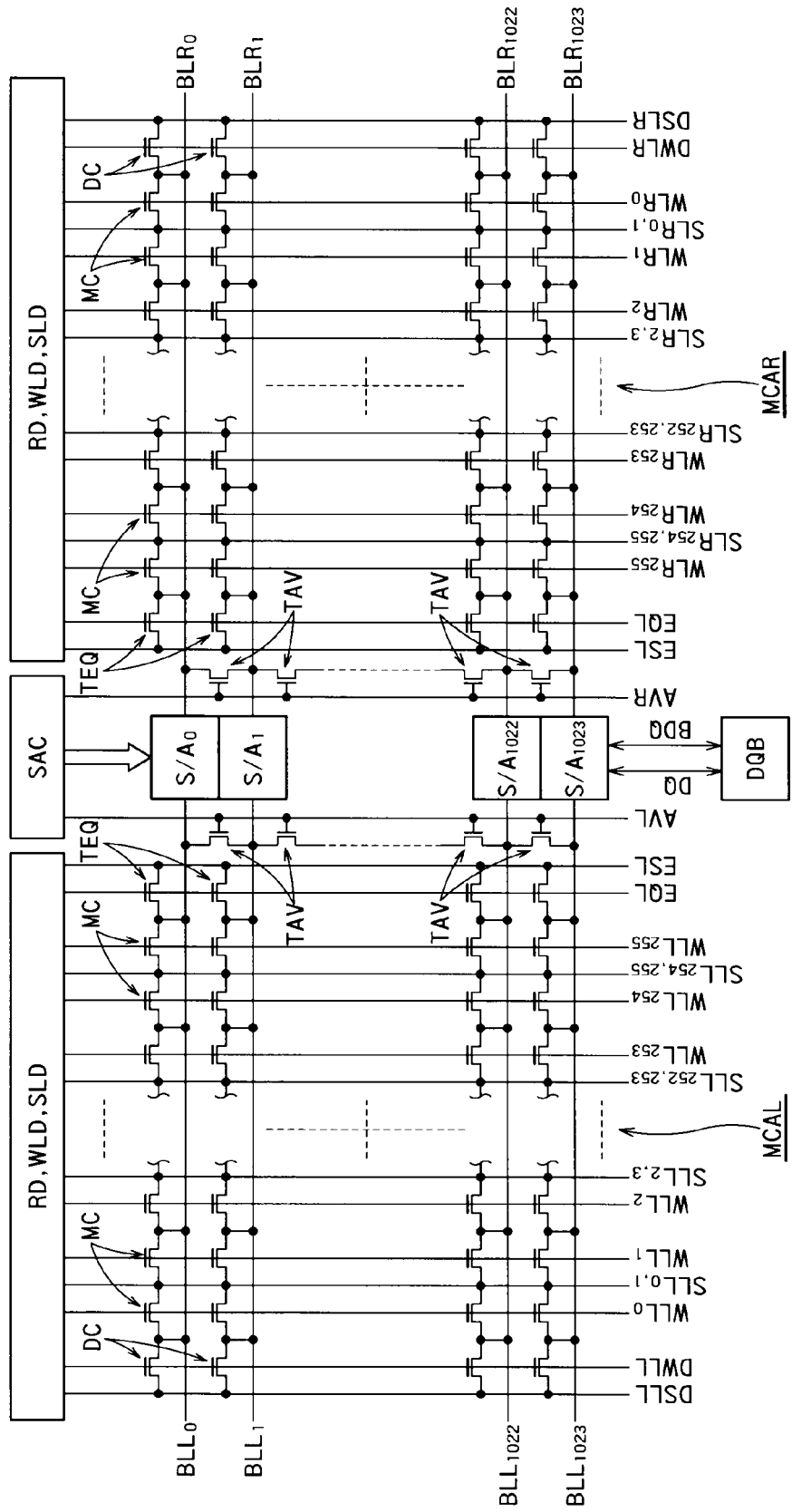
FIG. 1 shows a configuration of an FBC memory according to a first embodiment of the present invention.

FIG. 1 shows a configuration of an FBC memory according to a first embodiment of the present invention. The FBC memory comprises memory cells MC, dummy cells DC, word lines WLLi and WLRi (i is an integer) (hereinafter, also WL), dummy word lines DWLL and DWLR (hereinafter, also DWL), bit lines BLLi and BLRi (hereinafter, also BL), sense amplifiers S/Ai (hereinafter, also S/A), equalizing lines EQL, equalizing transistors TEQ, averaging lines AVL and AVR (hereinafter, also AV), averaging transistors TAV, source lines SLLi and SLRi (hereinafter, also SL), row decoders RD, word line drivers WLD, and source line drivers SLD.

The memory cells MC are arranged two-dimensionally in a matrix to constitute memory cell arrays MCAL and MCAR (hereinafter, also MCA). The word line WL extends in a row direction as a first direction and is connected to a gate of the memory cell MC. 256 word lines WL are provided on the left side and the right side of the sense amplifier S/A (WLL0 to WLL255 and WLR0 to WLR255). The bit line BL extends in a column direction as a second direction crossing the first direction and is connected to a drain of the memory cell MC. 1024 bit lines BL are provided on the left side and the right side of the sense amplifier S/A (BLL0 to BLL1023 and BLR0 to BLR1023). Two adjacent memory cells MC share the drain. The word line WL is perpendicular to the bit line BL and each memory cell MC is provided at an intersection of the word line with the bit line. Such a cell is called "cross point cell". The row direction and the column direction are determined merely for convenience and can be interchangeable.

The source line SL extends in the first direction in parallel with the word line WL and is connected to a source of the memory cell MC. 256 source lines SL are provided on the left side and the right side of the sense amplifier S/A (SLL0 to SLL255 and SLR0 to SLR255) like the word lines. One source line SL is provided for two adjacent word lines WL. Thus, each source line SL is connected to memory cells MC connected to the two adjacent word lines WL.

The dummy word line DWL extends in the row direction and is connected to a gate of the dummy cell DC. One dummy word line DWL is provided on the left side and the right side of the sense amplifier S/A.

The dummy cells DC are arranged in a direction the dummy word line DWL extends (row direction). Prior to a data read/write operation, the dummy cells DC store alternately data "0" and data "1" with the opposite polarity to each other in the arrangement direction. Data is usually written in the dummy cells DC immediately after a power supply is switched on. The polarity indicates the logical value "0" or "1" of the data. The same number of the dummy cells DC is provided for storing the data with the respective polarities. The dummy cell DC is for generating a reference current Iref when the data in the memory cell MC is detected. The reference current Iref is a substantially intermediate current between the currents flowing across "0" cells and "1" cells.

The equalizing line EQL is connected to a gate of the equalizing transistor TEQ. The equalizing transistor TEQ connects the bit line BL to an equalizing potential line ESL during a precharge period before and after the read/write operation to fix a voltage of each bit line BL to a certain value.

The averaging line AV is connected to a gate of the averaging transistor TAV. The averaging transistor TAV is connected between the bit lines BL and can short-circuit all bit lines BL in the memory cell array. The averaging transistor TAV short-circuits the dummy cell DC with the opposite polarity during data read to average a current flowing across the dummy cell DC. In this way, the reference current Iref is generated.

The sense amplifier S/A is connected to the bit line BL and configured to detect data stored in a selected memory cell MC or write data in the selected memory cell MC.

The WL driver WLD is configured to drive the word lines WL and the SL driver SLD is configured to drive the source lines SL.

The row decoder RD is described later. Because a sense amplifier controller SAC and a DQ buffer DQB can be the same as the conventional ones, descriptions thereof will be omitted.

Figure 2:
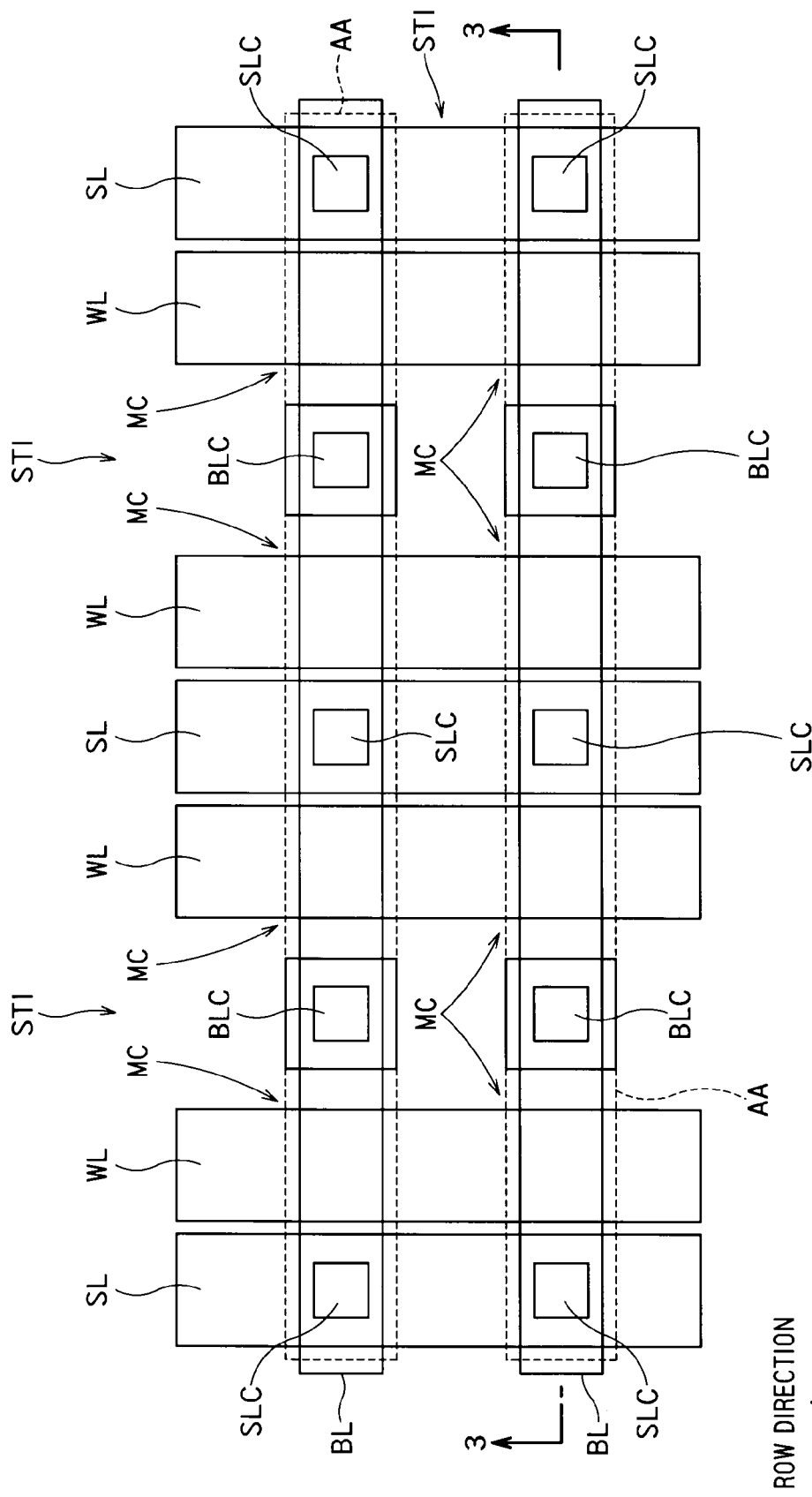
FIG. 2 is a plan view showing specifically eight memory cells MC.
Figure 3:
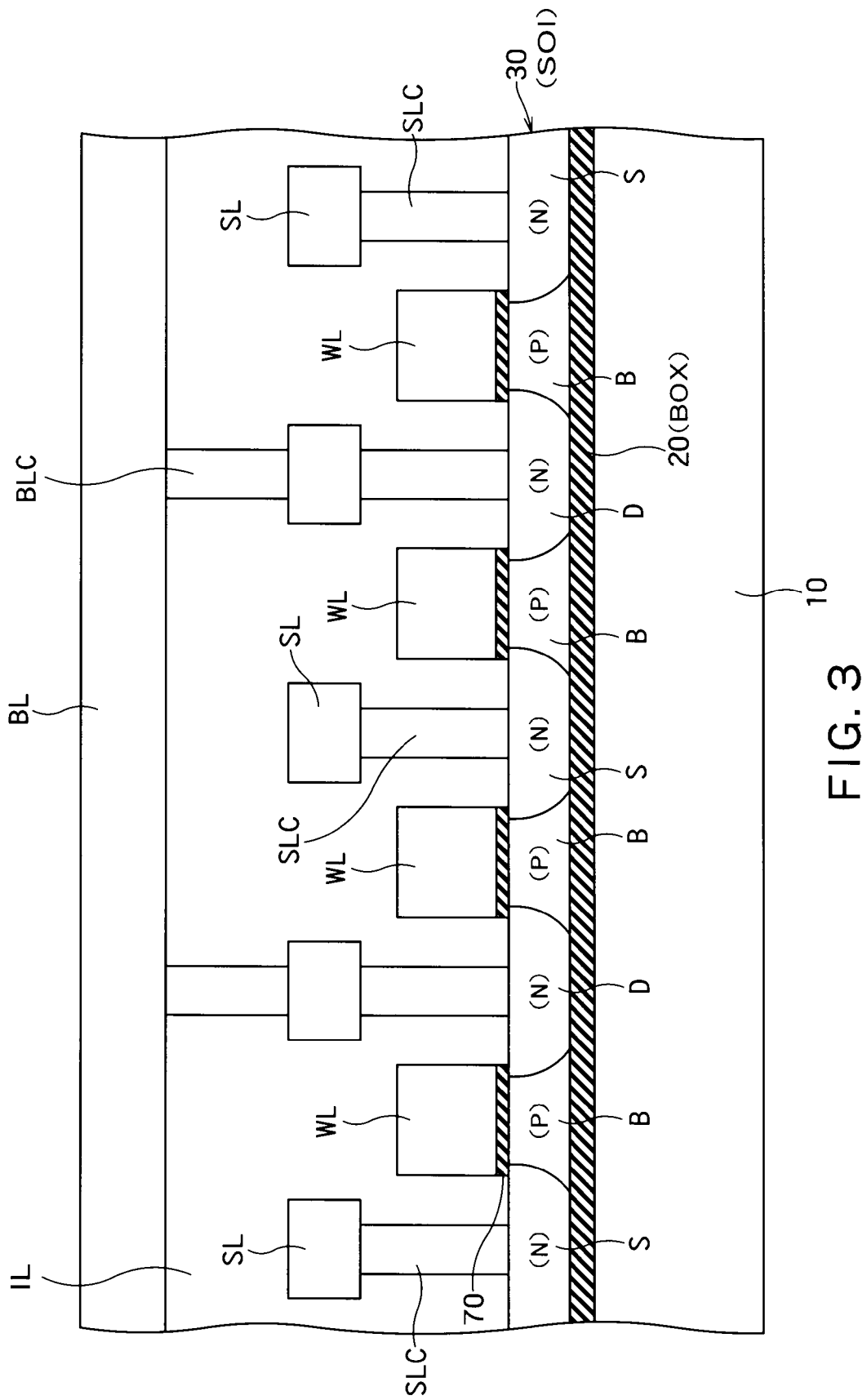
FIG. 3 is a cross-sectional view along a line 3-3 shown in FIG. 2.

FIG. 2 is a plan view showing specifically eight memory cells MC. FIG. 3 is a cross-sectional view along a line 3-3 shown in FIG. 2. A drain layer D of the memory cell MC is connected via a bit line contact BLC to the bit line BL. The bit line contact BLC is connected to two memory cells MC adjacent to each other in the column direction. A source layer S of the memory cell MC is connected via a source line contact SLC to the source line SL. The source line contact SLC is connected to the two memory cells MC adjacent to each other in the column direction. The bit line contact BLC and the source line contact SLC are provided alternately in the column direction. The bit line contact BLC and the source line contact SLC are shared respectively by the memory cells MC, so that the numbers of the bit line contacts BLC and the source line contacts SLC can be reduced, resulting in a reduced occupied area of the memory cell array.

The memory cell MC is provided on an SOI substrate comprising a support substrate 10, a BOX layer 20, and an SOI layer 30. The source layer S and the drain layer D are provided in the SOI layer 30. The body B is provided in the SOI layer 30 between the source S and the drain D. The body B is a semiconductor with the opposite conductive type to the source layer S and the drain layer D. The memory cell MC is an N-type FET in the first embodiment. The body B is surrounded by the source layer S, the drain layer D, the BOX layer 20, a gate dielectric film 70, and STI (Shallow Trench Isolation) (see FIG. 2) to be in an electrically floating state. The FBC memory can store binary data (0 or 1) depending on the number of majority carriers in the body B. A state that a large number of the majority carriers (holes) exist in the body B is indicated as data "1". A state that a small number of the majority carriers exist in the body is indicated as data "0". Thus, according to the first embodiment, an operation for writing binary data indicating less majority carriers means the operation for writing the data "0" in the memory cell MC. An operation for writing the binary data indicating more majority carriers means the operation for writing the data "1" in the memory cell MC.

Figure 4:
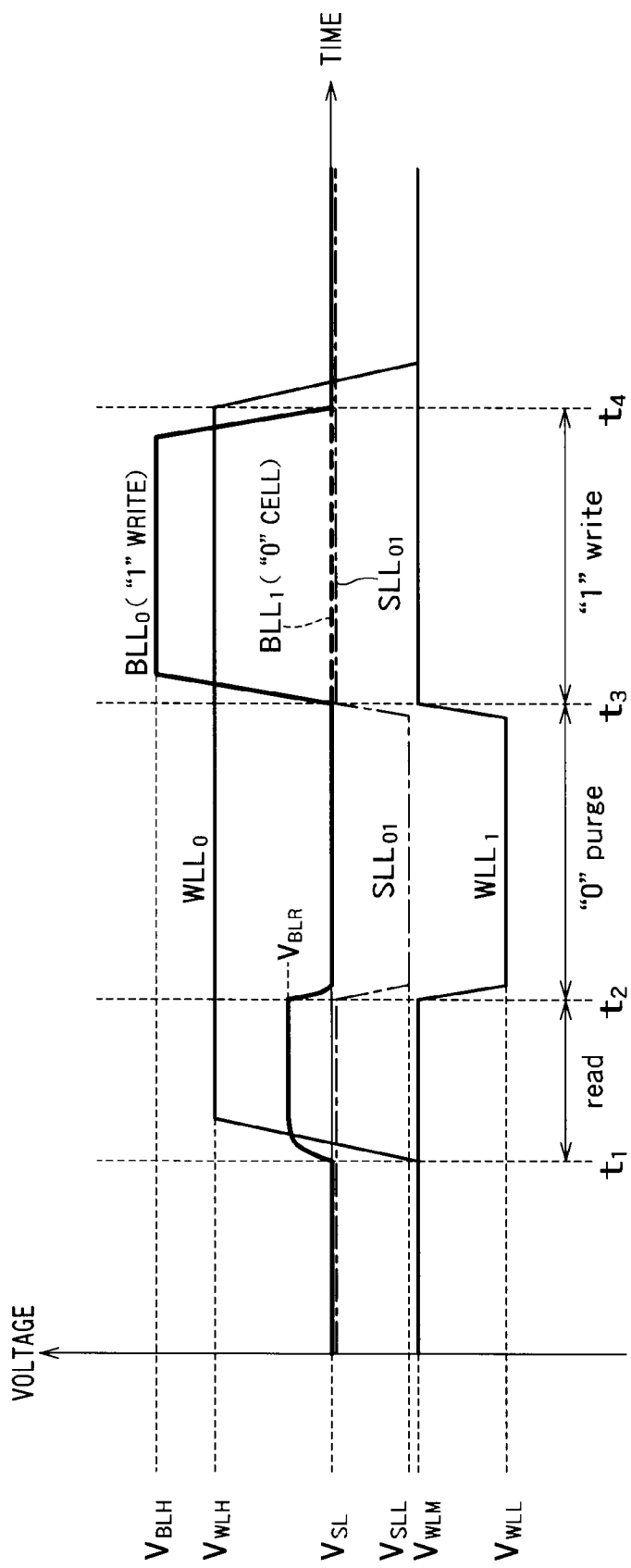
FIG. 4 is a timing diagram showing a data write operation of the FBC memory according to the first embodiment.

FIG. 4 is a timing diagram showing a data write operation of the FBC memory according to the first embodiment.

The WL driver WLD selects the word line WLL0 and the sense amplifier S/A writes data in memory cells MC connected to the word line WLL0 in the first embodiment. That is, the word line WLL0 is a selected word line (first word line). The source line SLL01 corresponding to the selected word line WLL0 is a selected source line. The word line WLL1 is an unselected word line (second word line) sharing the selected source line SLL01 with the selected word line WLL0. Other word lines WLL3 to WLL255 are unselected word lines (third word lines) that do not share the source line SLL01 with the selected word line. Which word lines WLLi (i is an integer) become the first to third word lines is determined when the selected word line is determined.

Because a write operation for the memory cell array MCAR can be inferred easily from a write operation for the memory cell array MCAL, descriptions thereof will be omitted.

In the data write operation, the sense amplifier S/A detects temporarily data in all memory cells MC connected to the selected word line and latches the data. After write data is stored in the sense amplifier S/A in a column that write is performed, the sense amplifier S/A writes or restores the latched data in the memory cells MC. More specific operations are described below.

In a data holding state before t1, all word lines WL are kept at a low level VWLM. All source lines SL and all bit lines BL are kept at the ground potential VSL (e.g., 0 V). Thus, a body potential becomes negative and holes stored in "1" cells can be held.

A data read operation is performed from t1 to t2. At t1, the WL driver WLD makes the selected word line WLL0 rise to a high level potential VWLH. Thus, channels are formed in memory cells MC connected to the selected word line WLL0. At the same time, the sense amplifier S/A makes the bit lines BL in all columns rise to a read potential VBLR. The sense amplifier S/A thus detects the data of the memory cells MC connected to the selected word line WLL0. The sense amplifier S/A includes a latch circuit (not shown). The latch circuit latches the detected data at a sense node (not shown) in the sense amplifier S/A.

A "0" purge operation is performed from t2 to t3. In the "0" purge operation, data "0" serving as a first logical data is written in memory cells MC in all columns connected to the selected word line WLL0.

The SL driver SLD makes the voltage of the selected source line SLL01 fall to a low level potential VSLL at t2. That is, the voltage of the selected source line SLL01 is shifted in a direction away from the voltage of the selected word line WLL0. At this time, the WL driver WLD makes the voltage of the unselected word line WLL1 fall to a low level potential VWLL while keeping the voltage of the selected word line WLL0 at VWLH. That is, the voltage of the unselected word line WLL1 is shifted in the same direction as the transition direction of voltage of the selected source line SLL01. The sense amplifier S/A returns voltages of the bit lines BL in all columns to the ground potential VSL which is a bit line potential under the data holding state.

Holes in "1" cells connected to the selected word line WLL0 are discharged in the source layer connected to the selected source line SLL01. Because the unselected word line WLL1 is made to fall to the low level potential VWLL lower than the low level potential VSLL of the selected source line SLL01, holes in "1" cells connected to the unselected word line WLL1 are kept. That is, when the "0" purge is performed upon all memory cells MC connected to the selected word line WLL0, memory cells MC connected to the unselected word line WLL1 sharing the source line with the selected word line WLL0 are not affected by disturb.

Data "1" is written selectively from t3 to t4. The SL driver SLD shifts the voltage of the selected source line SLL01 so as to approach the voltage of the selected word line WLL0 at t3. More specifically, the SL driver SLD returns the voltage of the selected source line SLL01 from VSLL to the potential VSL under the data holding state. The sense amplifier S/A makes the potential of the bit line BLL0 in the column the data "1" is written rise to a high level potential VBLH immediately after t3. That is, the sense amplifier S/A shifts the potential of the bit line BLL0 in the selected column in a direction of potential VWLH of the word line WLL0. Thus, impact ionization occurs between the body and the drain of a memory cell MC the data "1" is written. Holes generated by the impact ionization are accumulated in the body of the memory cell MC, so that the data "1" is written.

On the other hand, in a column that not the data "1" but the data "0" is written, the data "0" has been already written in the memory cell MC by "0" purge. Thus, in the column the data "0" is written, the sense amplifier S/A keeps the voltage of the bit line BLL1 at the bit line potential VSL under the data holding state. Impact ionization does not occur in the "0" cell.

The WL driver WLD returns the voltage of the unselected word line WLL1 to the word line voltage VWLM under the data holding state at t3. That is, the voltage of the unselected word line WLL1 is shifted in a direction approaching the voltage of the selected word line WLL0. If the voltage of the unselected word line WLL1 is kept at the low level potential VWLL, the gate voltage VWLL of memory cells MC connected to the unselected word line WLL1 and the bit line BLL0 is much lower than the drain voltage VBLH. In this case, a voltage with a voltage difference VBLH-VWLL is applied to the gate-drain of a "0" cell. Because a deep potential well is then formed in the body of the memory cell MC, the "0" cell may be subject to disturb by GIDL. To suppress such disturb caused by GIDL, the WL driver WLD returns the unselected word line WLL1 to the word line potential VWLM under the data holding state before making the bit line BLL0 rise to VBLH. Because the unselected word line WLL1 is returned to VWLM, a voltage difference VBLH-VWLM lower than the voltage difference VBLH-VWLL is applied to the gates-drains of the "0" cells connected to the unselected word line WLL1 and the bit line BLL0.

A timing of making the second word line WLL1 rise to VWLM needs to be between the point when the potential of the selected source line SLL01 starts to rise and the point when the potential of the selected bit line BLL0 reaches VBLH. That is, the point when the potential of the second word line WLL1 starts to rise is after the point when the potential of the selected source line SLL01 starts to rise. The point the potential of the second word line WLL1 reaches VWLM is before the point when the potential of the selected bit line BLL0 reaches VBLH. Consequently, "1" cells connected to the second word line WLL1 can be prevented from being subject to disturb. The data "1" can be prevented from being written in "0" cells connected to the bit line BLL1 and the word line WLL1.

The sense amplifier S/A returns the voltage of the bit line BLL0 from the "1" write potential VBLH to the bit line potential VSL under the data holding state and the WL driver WLD returns the voltage of the selected word line WLL0 from the channel forming potential VWLH to the word line potential VWLM under the data holding state. Thus, the FBC memory is in the data holding state after t4.

Unselected word lines WLL3 to WLL255 other than the word lines WLL0 and WLL1 are kept at the word line potential VWLM under the data holding state during the data write operation. Source lines other than the selected source line SLL01 are kept at the source line potential VSL under the data holding state during the data write operation.

Figure 5:
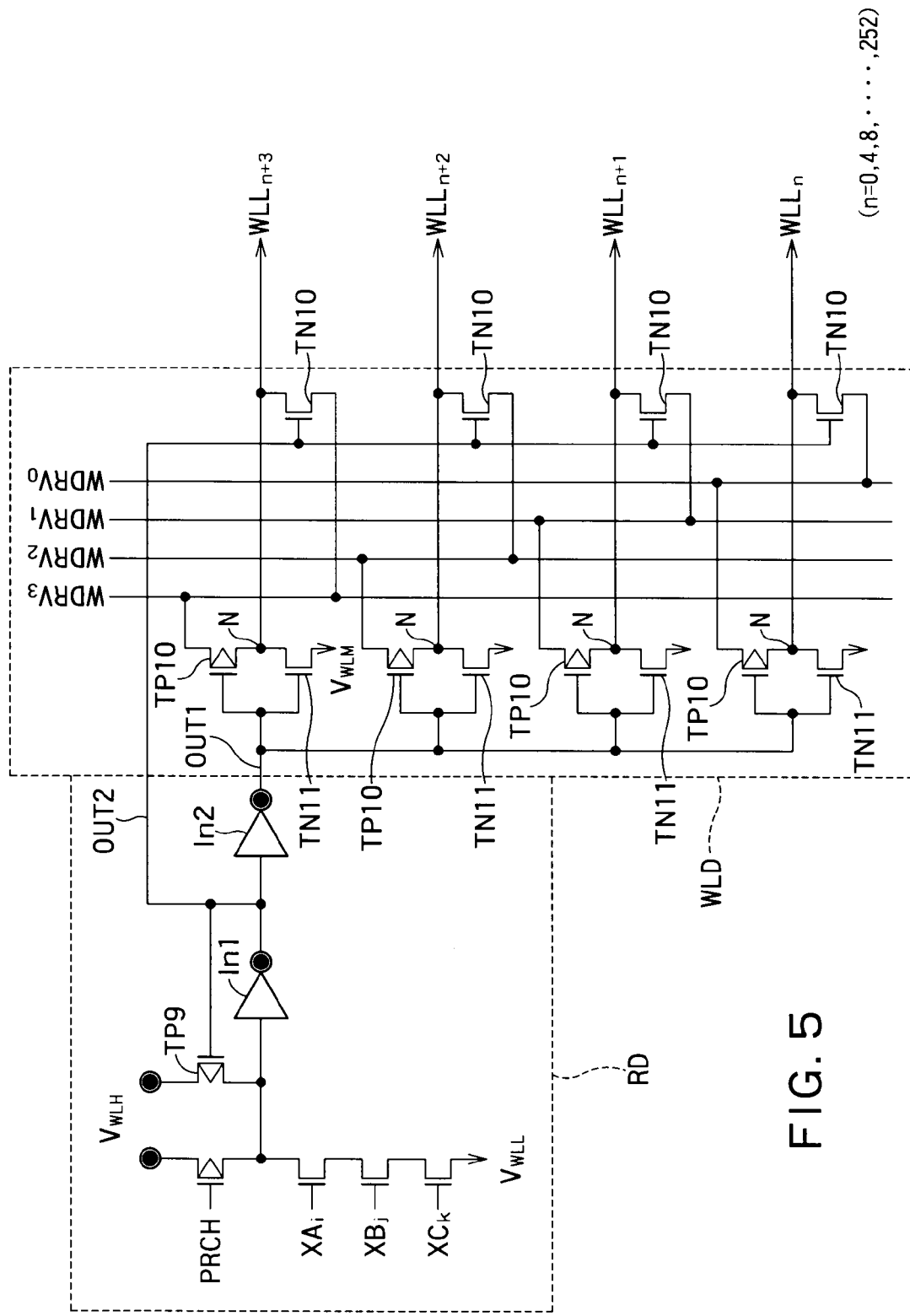
FIG. 5 is a circuit diagram showing the configuration of the row decoder RD and the WL driver WLD.

FIG. 5 is a circuit diagram showing the configuration of the row decoder RD and the WL driver WLD. The row decoder RD is configured, when selected by addresses XAi, XBj, and XCk (XAi, XBj, and XCk are all logically high), to output logically low from an output OUT1 and logically high from an output OUT2.

The WL driver WLD includes word drive lines WDRV0 to WDRV3. P-type transistors TP10 and N-type transistors TN11 are connected serially between the respective word drive lines WDRV0 to WDRV3 and the word line potential VWLM under the data holding state. Gates of the transistors TP10 and TN11 are connected to the output OUT1. When a node between the transistors TP10 and TN11 is indicated by N, the nodes N for the word drive lines WDRV0 to WDRV3 are connected to word lines WLLn to WLLn+3, respectively.

Further, N-type transistors TN10 are connected between the respective word drive lines WDRV0 to WDRV3 and the respective word lines WLLn to WLLn+3. Gates of the respective transistors TN10 are all connected to the output OUT2.

While the row decoder RD and the WL driver WLD shown in FIG. 5 control four word lines WLLn to WLLn+3, they can be configured to handle four or more word lines.

Under the data holding state, a precharge signal PRCH is activated to be logically low and the addresses XAi, XBj, and XCk are logically low. Thus, the output OUT1 is logically high and the output OUT2 is logically low. Accordingly, the word lines WLLn to WLLn+3 are all connected to the word line voltage VWLM under the data holding state.

The precharge signal PRCH is inactivated to be logically high during the read or write operation. When none of the word lines WLLn to WLLn+3 are selected, a P-type transistor TP9 is on, the output OUT1 is kept to be logically high, and the OUT2 is kept to be logically low.

When any of the word lines WLLn to WLLn+3 is selected during the read or write operation, the addresses XAi, XBj, and XCk are all logically high and the low level voltage VWLL is connected to an inverter In1. Thus, the transistor TP9 is switched off and the outputs OUT1 and OUT2 become logically low and logically high, respectively. The transistors TN10 and TP10 are switched on and the word drive lines WDRV0 to WDRV3 are connected to the word lines WLLn to WLLn+3, respectively.

Figure 6:
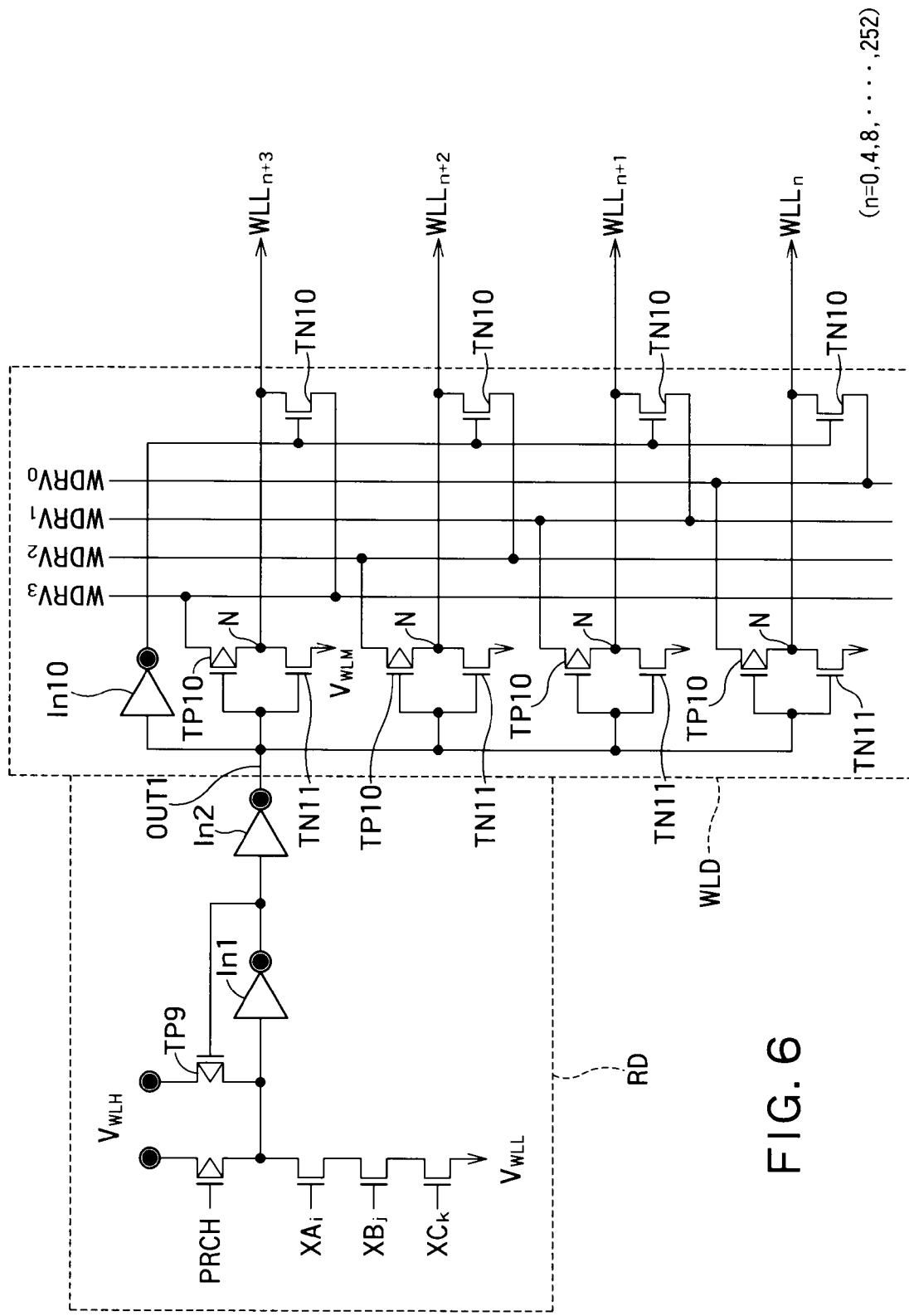
FIG. 6 is a circuit diagram showing a modified example of the row decoder RD and the WL decoder WLD.

FIG. 6 is a circuit diagram showing a modified example of the row decoder RD and the WL decoder WLD. The row decoder RD according to the modified example has only the output OUT1 and does not have the output OUT2. The gate of the transistor TN10 is connected via an inverter In10 to the output OUT1. The configuration shown in FIG. 6 thus has the same function as the row decoder RD and the WL decoder WLD shown in FIG. 5.

The transistors in the row decoder RD and the WL driver WLD shown in FIGS. 5 and 6 can have the opposite conductive type and addresses and signals inputted to the row decoder RD can have the opposite logic. In such cases, the row decoder RD and the WL driver WLD with the same function as in the row decoder RD and the WL driver WLD according to the first embodiment can be obtained.

Figures 7A, 7B:
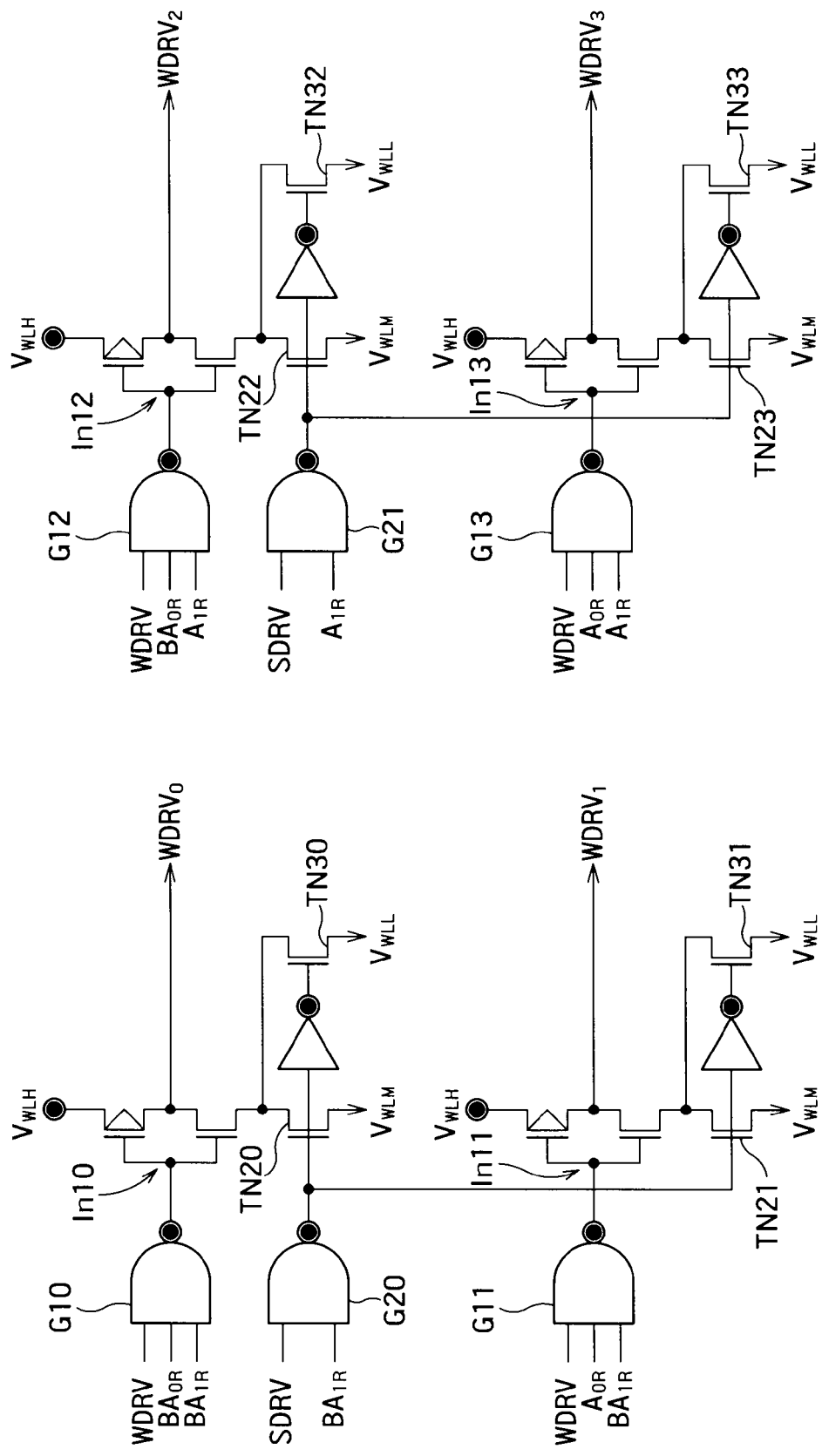
FIGS. 7A and 7B are circuit diagrams showing drive circuits for the word drive lines WDRV0 to WDRV3.

FIGS. 7A and 7B are circuit diagrams showing drive circuits for the word drive lines WDRV0 to WDRV3. A0R and A1R are addresses for selecting any of the four word lines WLLn to WLLn+3 for one row decoder RD. BA0R and BA1R are inverted signals of A0R and A1R, respectively. For example, when (A0R, A1R) is (0, 0), (1, 0), (0, 1), or (1, 1), the word drive lines WDRV0, WDRV1, WDRV2, and WDRV3 are activated respectively. "0" in parentheses indicates the logically low state and "1" in parentheses indicates the logically high state.

The drive circuits for the word drive lines WDRV0 to WDRV3 comprise control signals WDRV for activating the word drive line WDRVi, NAND gates G10 to G13 receiving two of the addresses A0R, A1R, BA0R, and BA1R as an input and outputting the NAND operational result thereof, inverters In10 to In13 inverting the outputs of the NAND gates G10 to G13 to send them to the respective word drive lines WDRV0 to WDRV3, control signals SDRV for driving source lines, and NAND gates G20 to G21 receiving the address A1R or its inverted signal BA1R for selecting a word line pair sharing a source as an input to output the NAND operational result thereof.

The inverters In10 to In13 are connected to the selected word line potential VWLH which is a high level potential. The inverters In10 to In13 are further connected via n-type transistors TN30 to TN33 to the low level potential VWLL and via n-type transistors TN20 to TN23 to the second low level potential VWLM. The outputs of the NAND gates G20 to G21 are applied to the gates of the transistors TN20 to TN23. Inverted outputs thereof are applied to the gates of the transistors TN30 to TN33.

The control signal WDRV is activated during the data write operation (from t1 to t4) shown in FIG. 4. The control signal SDRV is activated during the "0" purge (from t2 to t3).

During the "0" purge, (WDRV, SDRV) is (1, 1). At this time, the transistors TN20 and TN21 (or TN22 and TN23) corresponding to the selected word line pair are switched off and TN30 and TN31 (or TN32 and TN33) are switched on. The transistors TN22 and TN23 (or TN20 and TN21) corresponding to an unselected word line pair are switched on and TN32 and TN33 (or TN30 and TN31) are switched off. Thus, the second low level potential VWLM is applied to the unselected word line pair (third word line) that does not share the source line with the selected word line. The high level voltage VWLH is applied to the selected word line (first word line). The first low level potential VWLL (<VWLM) is applied to the unselected word line (second word line) sharing the source line with the selected word line.

During the data "1" write, (WDRV, SDRV) is (1, 0). At this time, the outputs of the NAND gates G20 to G21 become "H" level regardless of the address A1R or its inverted signal BA1R. Accordingly, the transistors TN20 to TN23 are switched on. The second low potential VWLM is thus applied to all unselected word lines. The high level voltage VWLH is still applied to the selected word line.

(WDRV, SDRV) is (0, 0) when the word drive line drive circuits are inactivated. In this case, the outputs of the NAND gates G10 to G13 become "H" level regardless of A0R, A1R, BA0R, or BA1R. The outputs of the NAND gates G20 to G21 also become "H" level regardless of the address A1R or its inverted signal BA1R, so that the transistors TN20 to TN23 are switched on. Thus, the word drive lines WDRV0 to WDRV3 all have the second low potential VWLM.

That is, during the "0" purge driving source lines, the drive circuit applies the high level potential VWLH to the selected word line (first word line), the first low level potential VWLL to the unselected word line (second word line) sharing the source with the selected word line, and the second low level potential VWLM to other unselected word lines (third word lines). During the selective data "1" write, the high level potential VWLH is applied to the selected word line and the second low level potential VWLM is applied to all unselected word lines. It suffices that the drive circuits for the word drive lines WDRV0 to WDRV3 are configured to lower the potential of the unselected word line sharing the source with the selected word line to a potential lower than a normal data holding potential, and are not limited to the configurations shown in FIGS. 7A and 7B.

Figure 8:
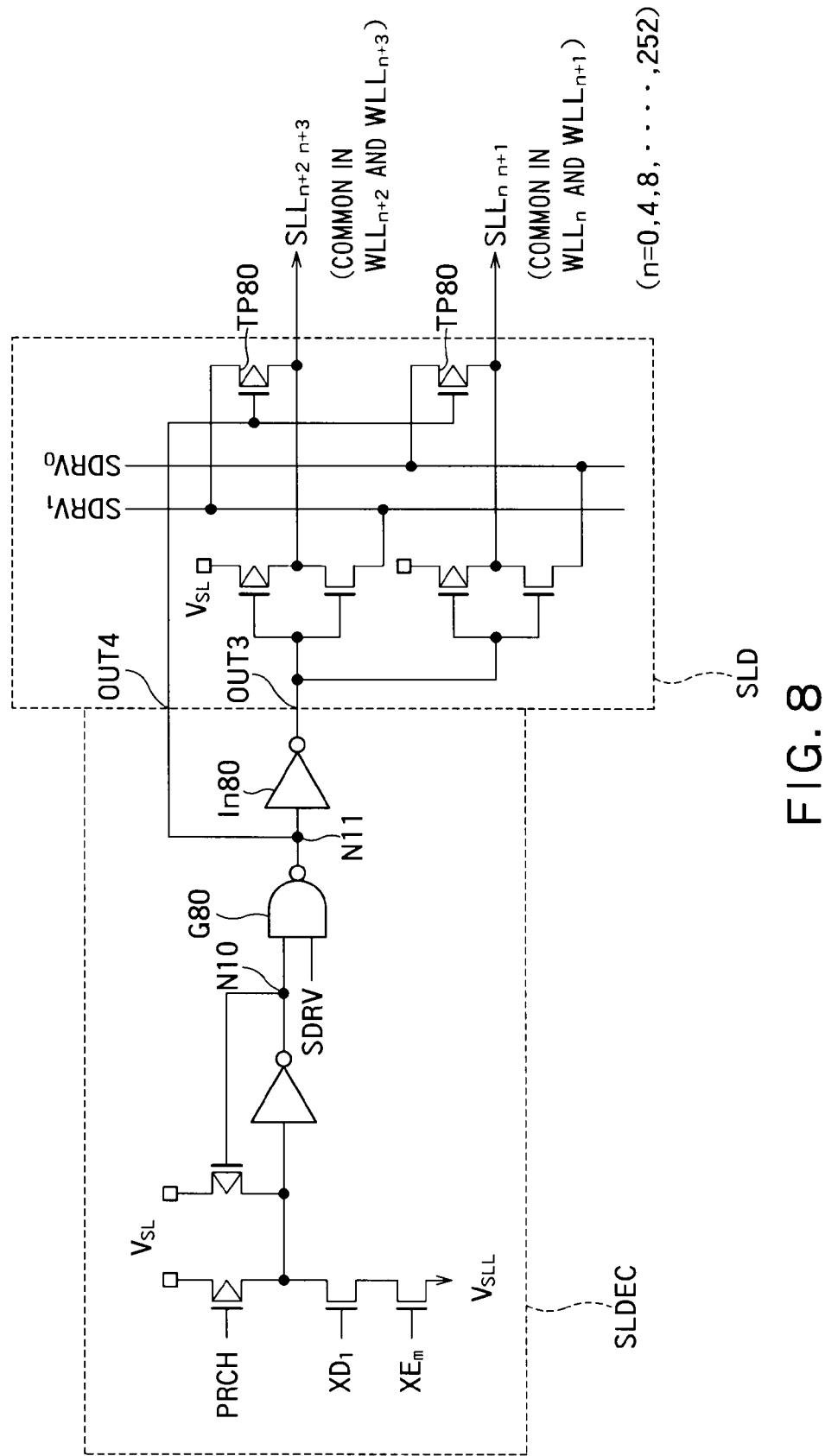
FIG. 8 is a circuit diagram showing a configuration of an SL decoder SLDEC and the SL driver SLD.

FIG. 8 is a circuit diagram showing a configuration of an SL decoder SLDEC and the SL driver SLD. When the SL decoder SLDEC is selected by addresses XDI and XEm (when XDI and XEm are logically high), a node N10 transmits logically high. The source drive signal SDRV is activated when the source line SL is driven from the voltage VSL under the data holding state. The source drive signal SDRV is activated to be logically high during the "0" purge from t2 to t3 in the first embodiment. When the source drive signal SDRV is activated, a non-inverted signal of the node N10 is outputted as an output OUT3 and an inverted signal of a signal at the node N10 (signal at a node N11) is outputted as an output OUT4.

The SL driver SLD includes a plurality of p-type transistors TP80. The transistors TP80 are connected between the source drive line SDRV0 and the source line SLLn, n+1 and between the source drive line SDRV1 and the source line SLLn+2, n+3. Gates of the transistor TP80 are connected to the node N11 between the NAND gate G80 and the inverter In80.

When the SL decoder SLDEC is selected, the node N10 is logically high. Thus, at the point when the source drive signal SDRV is activated to be logically high, the outputs OUT3 and OUT4 (node N11) become logically high and logically low, respectively. Consequently, the source drive lines SDRV0 and SDRV1 are connected to the source lines SLLn, n+1 and SLLn+2, n+3, respectively.

When the SL decoder SLDEC is not selected, the source lines SLLn, n+1 and SLLn+2, n+3 are kept at the voltage VSL under the data holding state.

Figure 9:
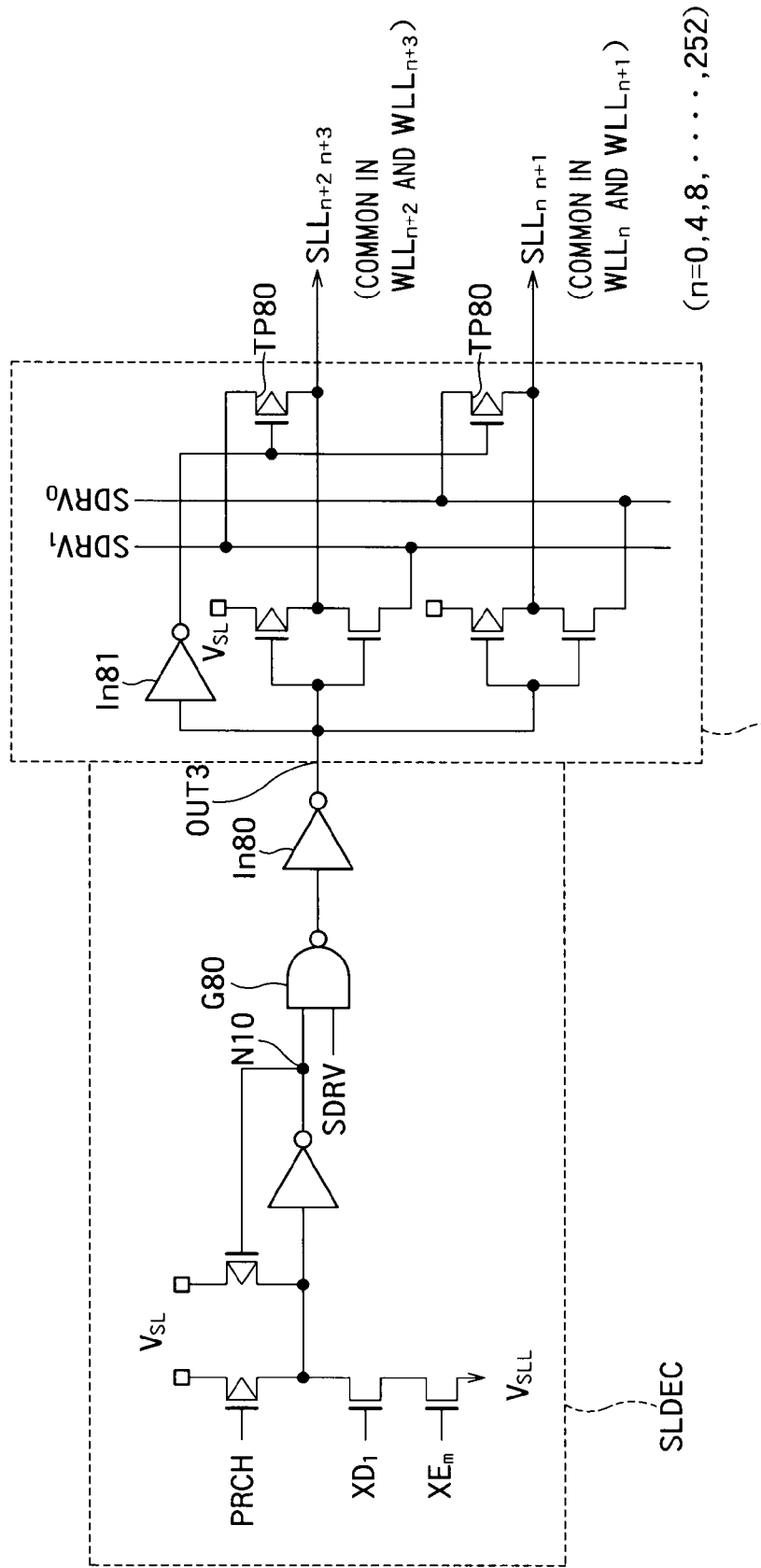
FIG. 9 is a circuit diagram showing a modified example of the SL decoder SLDEC and the SL driver SLD.

FIG. 9 is a circuit diagram showing a modified example of the SL decoder SLDEC and the SL driver SLD. The SL decoder SLDEC according to the modified example has only the output OUT3 and does not have the output OUT4. The node N11 is connected to the gate of the p-type transistor TP80 in FIG. 8. According to the modified example shown in FIG. 9, the output OUT3 is connected via an inverter In81 to the gate of the transistor TP80. Thus, the configuration shown in FIG. 9 has the same function as the one shown in FIG. 8.

Transistors in the SL decoder SLDEC and the SL driver SLD shown in FIG. 8 or 9 can have the opposite conductive type and addresses and signals inputted to the SL decoder SLDEC can have the opposite logic. In such cases, the SL decoder SLDEC and the SL driver SLD with the same function as the SL decoder SLDEC and the WL driver WLD in the first embodiment can be obtained.

Figure 10A:
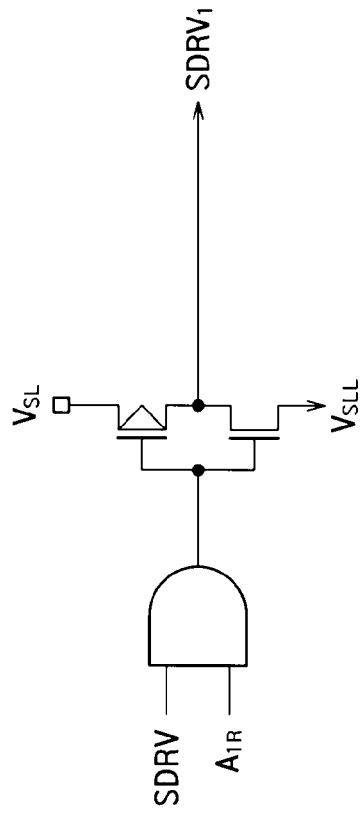
FIGS. 10A and 10B are circuit diagrams showing drive circuits for the source drive lines SDRV0 and SDRV1.
Figure 10B:
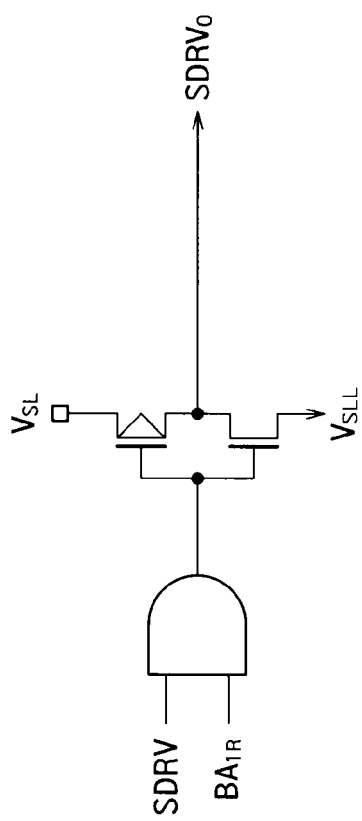

FIGS. 10A and 10B are circuit diagrams showing drive circuits for the source drive lines SDRV0 and SDRV1. The address A1R is for selecting one of two source lines SLLn, n+1 and SLLn+2, n+3 for one SL decoder SLDEC. For example, when the source drive signal SDRV is logically high and A1R is logically low, the voltages of the source drive lines SDRV0 and SDRV1 are VSLL and VSL, respectively. When A1R is logically high, the voltages of the source drive lines SDRV0 and SDRV1 are VSL and VSLL, respectively.

When the source drive signal SDRV is logically low, the voltages of the source drive lines SDRV0 and SDRV1 are kept at VSL regardless of the logical values of A1R and BA1R.

By combining FIG. 8 or FIG. 9 with FIGS. 10A and 10B, the voltage of the selected source line can be set to the voltage VSLL during "0" purge and the voltage of the unselected source line can be set to the voltage VSL under the data holding state.

The SL driver SLD shifts the potential of the selected source line away from the potential of the selected word line during "0" purge in the first embodiment. The WL driver WLD then lowers the potential of the unselected word line (second word line) sharing the source line with the selected word line to the potential VWLL lower than the word line potential VWLM under the data holding state. Thus, disturb of "1" cells connected to the second word line can be reduced. The voltage variation of the second word line (VWLM-VWLL) is preferably equal substantially to the potential variation of the selected source line (VSL-VSLL). This is because the gate-source voltage of a memory cell MC connected to the second word line is substantially equal to the one under the data holding state.

The potentials of the selected source line and the second word line are returned to the potentials VSL and VWLM under the data holding state, respectively during "1" write. Thus, disturb of "0" cells connected to the bit line in a column that "1" is written and the second word line caused by GIDL can be reduced.

Second Embodiment

Figure 11:
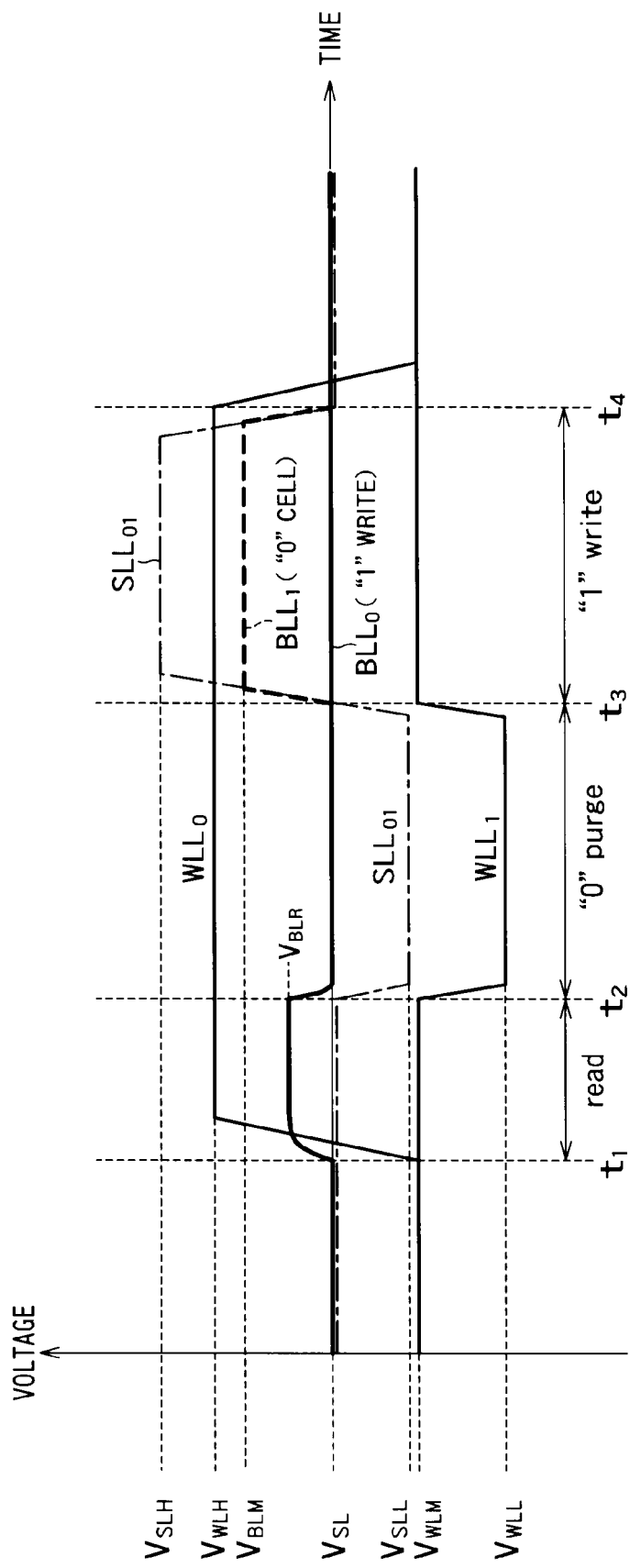
FIG. 11 is a timing diagram showing a data write operation of an FBC memory according to a second embodiment of the present invention.

FIG. 11 is a timing diagram showing a data write operation of an FBC memory according to a second embodiment of the present invention.

According to the second embodiment, during "1" write, the source line SLL01 is selected instead of the bit line BLL0 and this source line is made to rise to the high level potential VSLH. Data "1" is thus written in a memory cell MC by impact ionization occurring between the body and the source of the memory cell MC. The voltage of the bit line BLL0 connected to the selected memory cell MC is kept at the bit line potential VSL under the data holding state.

The high level potential VSLH of the source line SLL01 can be the same as the high level potential VBLH of the bit line shown in FIG. 4. The potential of the bit line BLL1 in an unselected column that data "1" is not written is VBLM lower than VSLH and VWLH but higher than VSL. Thus, impact ionization in the memory cells MC in the unselected column is prevented.

Read and "0" purge operations from t1 to t3 can be the same as in the first embodiment. The timing of making the second word line WLL1 rise to VWLM is preferably between the point when the potential of the selected source line SLL01 starts to rise and the point when the potential of the selected source line SLL01 reaches VSL. That is, the point when the potential of the second word line WLL1 starts to rise is after the point when the potential of the selected source line SLL01 starts to rise and the point when the potential of the second word line WLL1 reaches VWLM is before the point when the potential of the selected source line SLL01 reaches VSLH. Thus, "1" cells connected to the second word line WLL1 can be prevented from being subject to disturb. Further, data "1" can be prevented from being written in "0" cells connected to the bit line BLL1 and the word line WLL1.

A timing of making the voltage of the bit line BLL1 rise to VBLM is preferably before the timing of making the voltage of the selected source line SLL01 rise to VSLH. Thus, it is possible to prevent the data "1" from being written in "0" cells connected to the word line WLL0 and the bit line BLL1.

A timing of returning the voltage of the bit line BLL1 to VSL needs to be after a timing of returning the voltage of the selected source line SLL01 to VSL. Thus, it is possible to prevent the data "1" from being written in the "0" cells connected to the word line WLL0 and the bit line BLL1.

The operation of the unselected word line WLL1 (second word line) sharing the source line SLL01 with the selected word line WLL0 can be the same as the operation of the second word line WLL1 shown in FIG. 4.

Figure 12:
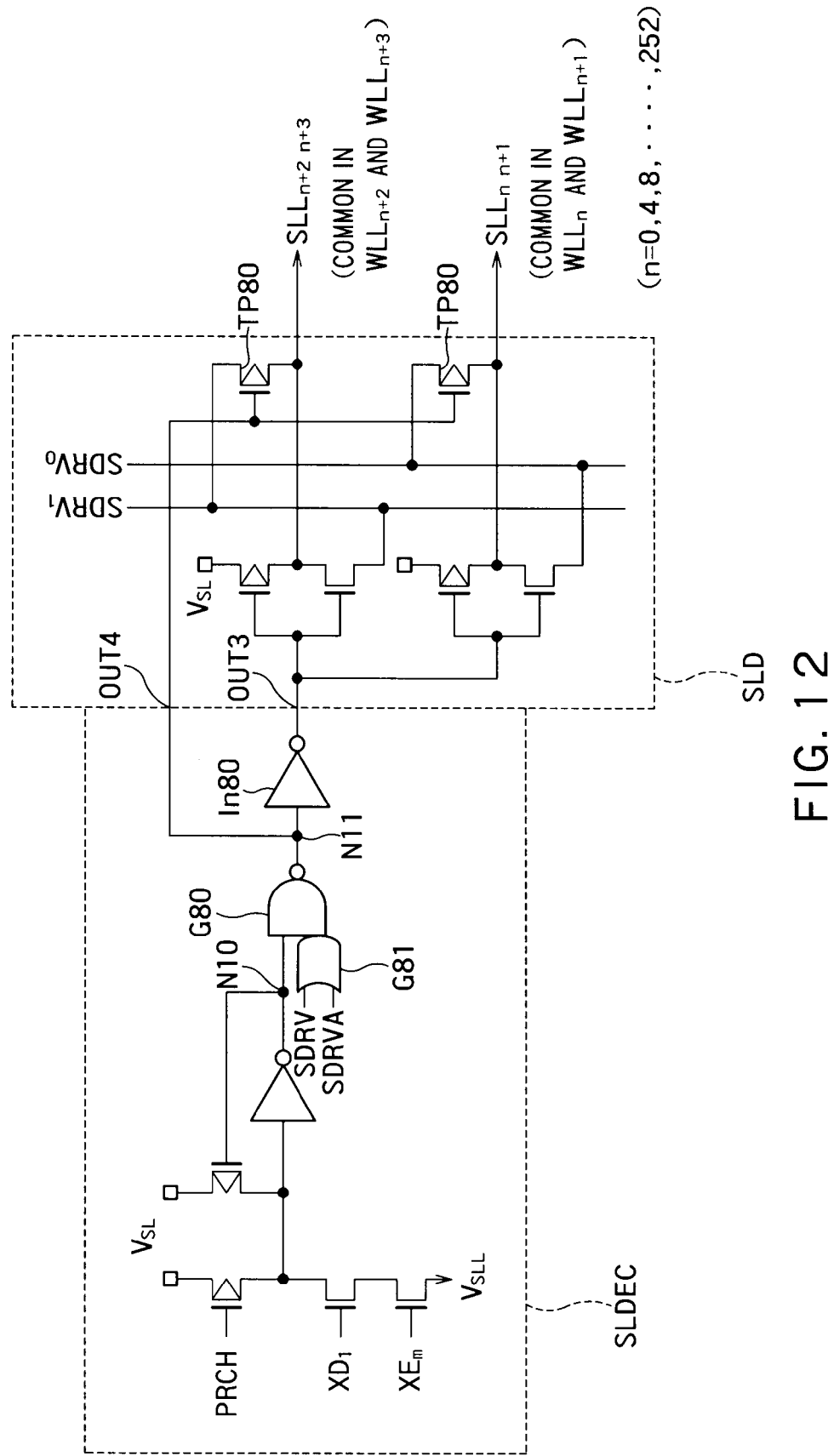
FIG. 12 is a circuit diagram showing the configuration of an SL decoder SLDEC and an SL driver SLD according to the second embodiment.

FIG. 12 is a circuit diagram showing the configuration of an SL decoder SLDEC and an SL driver SLD according to the second embodiment. The SL decoder SLDEC of the second embodiment is different from the one in the first embodiment that an OR gate G81 is connected to one input of the NAND gate G80. Other configurations of the SL decoder SLDEC in the second embodiment can be the same as those in the first embodiment.

The OR gate G81 receives the source drive signals SDRV and SDRVA as an input. When either the source drive signal SDRV or SDRVA is activated to be logically high, the gate G80 transmits an inverted signal of a signal at the node N10 to the node N11. The source drive signal SDRVA is activated during "1" write.

During the "0" purge (from t2 to t3) and the "1" write (from t3 to t4), the selected source lines SLLn, n+1 and SLLn+2, n+3 are connected to the source drive lines SDRV0 and SDRV1, respectively.

The SL decoder SLDEC shown in FIG. 12 can be modified so as to have the configuration shown in FIG. 9, of course. That is, the output OUT4 can be omitted and the output OUT3 can be connected via the inverter In81 to the gate of the transistor TP80.

FIGS. 13A and 13B are circuit diagrams showing drive circuits for the source drive lines SDRV0 and SDRV1. A NAND gate G180 shown in FIG. 13A receives the source drive signal SDRVA and BA1R as an input and outputs the operational result to an inverter In180. A NAND gate G181 receives the source drive signal SDRV and BA1R as an input and outputs the operational result to an n-type transistor Tn180. The NAND gate G181 outputs the inverted signal of the operational result to an n-type transistor Tn181.

The inverter In180 and the transistor Tn180 are connected serially to each other between the high level voltage VSLH for "1" write and VSL. The node between the inverter In180 and the transistor Tn180 is indicated by N180. The transistor Tn181 is connected between the node N180 and VSLL.

The relation of connection between NAND gates G182 and G183, inverters In181 and In183, and transistors Tn182 and Tn183 shown in FIG. 13B is the same as the one between the NAND gates G180 and G181, the inverters In180 and In182, and the transistors Tn180 and Tn181 shown in FIG. 13A. However, A1R is inputted to ones of inputs of the respective NAND gates G182 and G183.

For example, when BA1R becomes logically high (when SDRV0 is selected), the source drive signal SDRV becomes logically high and SDRVA becomes logically low during the "0" purge (from t2 to t3). The voltages of the source drive lines SDRV0 and SDRV1 are set to VSLL and VSL, respectively.

During the "1" write (from t3 to t4), the source drive signal SDRV becomes logically low and SDRVA becomes logically high. Thus, the voltages of the source drive lines SDRV0 and SDRV1 are set to VSLH and VSL, respectively.

When SDRV0 and SDRV1 are not selected, the source drive signals SDRV and SDRVA become logically low. The voltages of the source drive lines SDRV0 and SDRV1 are thus set to VSL.

Other configurations of the FBC memory according to the second embodiment can be the same as the configurations of the FBC memory according to the first embodiment.

During "1" write, the source line is selected instead of the bit line in the second embodiment. Thus, "0" cells connected to the bit line in a selected column are hardly subjected to disturb. Further, the second embodiment can achieve effects identical to those of the first embodiment.

Third Embodiment

Figure 14:
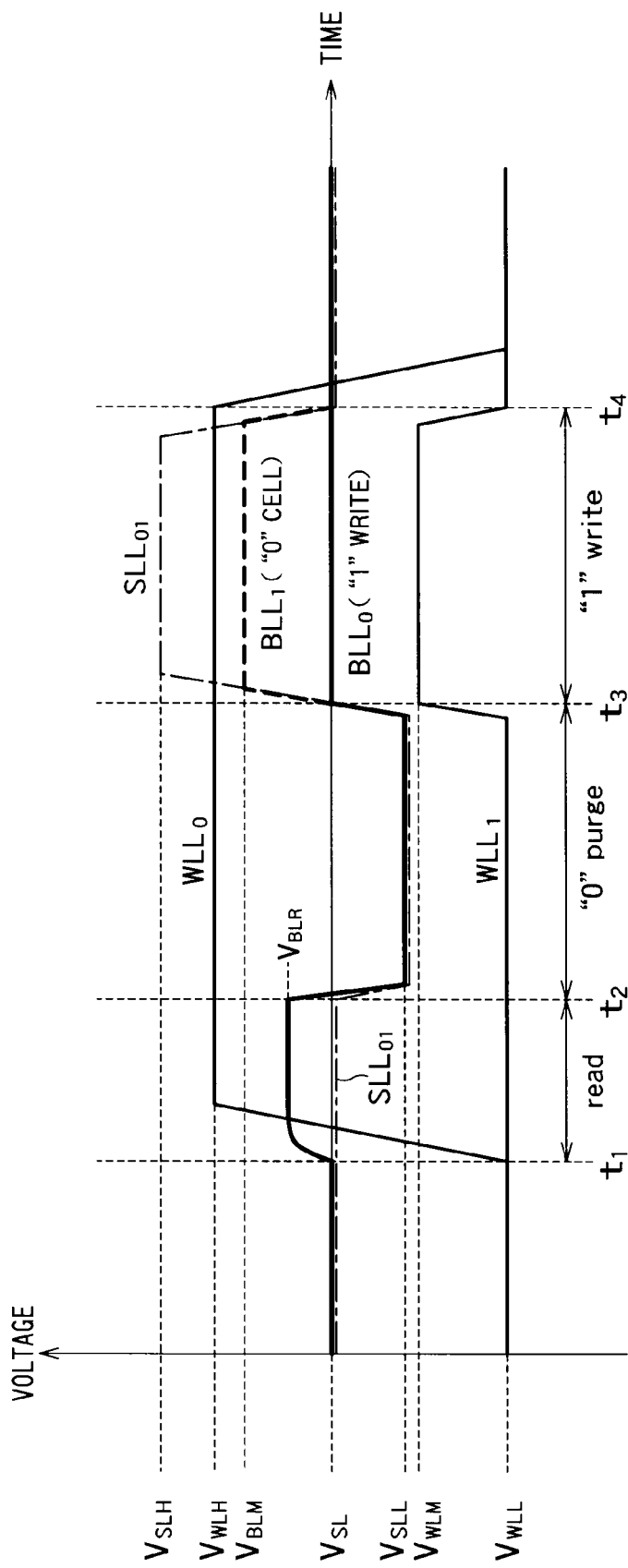
FIG. 14 is a timing diagram showing a data write operation of an FBC memory according to a third embodiment of the present invention.

FIG. 14 is a timing diagram showing a data write operation of an FBC memory according to a third embodiment of the present invention.

Configurations of the FBC memory according to the third embodiment can be the same as the configurations of the FBC memory according to the first embodiment.

The SL driver SLD shifts the voltage of the selected source line SLL01 in a direction opposite to the transition direction of the word line WLL0 to VSLL during "0" purge from t2 to t3 in the third embodiment. The sense amplifier S/A makes bit lines BL in all columns fall to the low level potential VSLL like the selected source line SLL01. Thus, holes in the body B are drawn from the source layer S and the drain layer D of a memory cell MC. To lower the selected source line SLL01 and the bit line BL to VSLL, the normal word line potential under the data holding state needs to be set to the potential VWLL lower than VWLM. This is to prevent "1" cells from being subject to disturb by the bit line BL because the bit lines BL in all columns are lowered to VSLL.

During the "0" purge, the voltages of the selected source line SLL01 and the bit line BL are set to be substantially equal to VSLL. Thus, a penetrating current does not flow between the source and the drain of the memory cell MC.

The "1" write operation is the same as in the second embodiment. According to the third embodiment, however, because the word line potential under the data holding state is low such as VWLL, the potential of the second word line WLL1 needs to rise to VWLM. That is, the WL driver WLD makes the voltage of the second word line WLL1 approach the voltage of the source line SLL01. "0" cells connected to the unselected word line WLL1 are thus hardly subjected to disturb caused by GIDL.

The timing of making the second word line WLL1 rise to VWLM is desirably before the timing of making the selected source line SLL01 rise to VSLH and these timings need not coincide with each other. This is because when the timing of making the second word line WLL1 rise to VWLM is before the timing of making the selected source line SLL01 rise to VSLH, "0" cells connected to the second word line WLL1 are not subject to disturb.

Further, the timing of making the second word line WLL1 rise to VWLM is preferably between the point when the potential of the selected source line SLL01 starts to rise and the point when the potential of the selected source line SLL01 reaches VSL. That is, the potential of the second word line WLL1 starts to rise is after the point when the potential of the selected source line SLL01 starts to rise and the point when the potential of the second word line WLL1 reaches VWLM is before the point when the potential of the selected source line SLL01 reaches VSLH. In this way, "1" cells connected to the second word line WLL1 are prevented from being subject to disturb. Further, it is possible to prevent data "1" from being written in "0" cells connected to the bit line BLL1 and the word line WLL1.

The timing of making the voltage of the bit line BLL1 rise to VBLM needs to be before the timing of making the voltage of the selected source line SLL01 rise to VSLH. Thus, it is possible to prevent data "1" from being written in "0" cells connected to the word line WLL0 and the bit line BLL1.

The selected source line SLL01 and the bit line BL are returned to the potential VSL under the data holding state and the word line WL is returned to the potential VWLL under the data holding state at nearly t4. The timing of returning the voltage of the bit line BLL1 to VSL needs to be after the timing of returning the voltage of the selected source line SLL01 to VSL. Thus, the data "1" can be prevented from being written in the "0" cells connected to the word line WLL0 and the bit line BLL1.

The timing of returning the voltage of the unselected word line WLL1 to VWLL needs to be after the timing of returning the selected source line SLL01 to VSL. Thus, "0" cells connected to the unselected word line WLL1 are hardly subjected to disturb caused by GIDL.

Unselected word lines WLL3 to WLL255 other than the word lines WLL0 and WLL1 are kept at the word line potential VWLL under the data holding state during the data write operation. Source lines other than the selected source line SLL01 are kept at the source line potential VSL under the data holding state during the data write operation.

Figure 15:
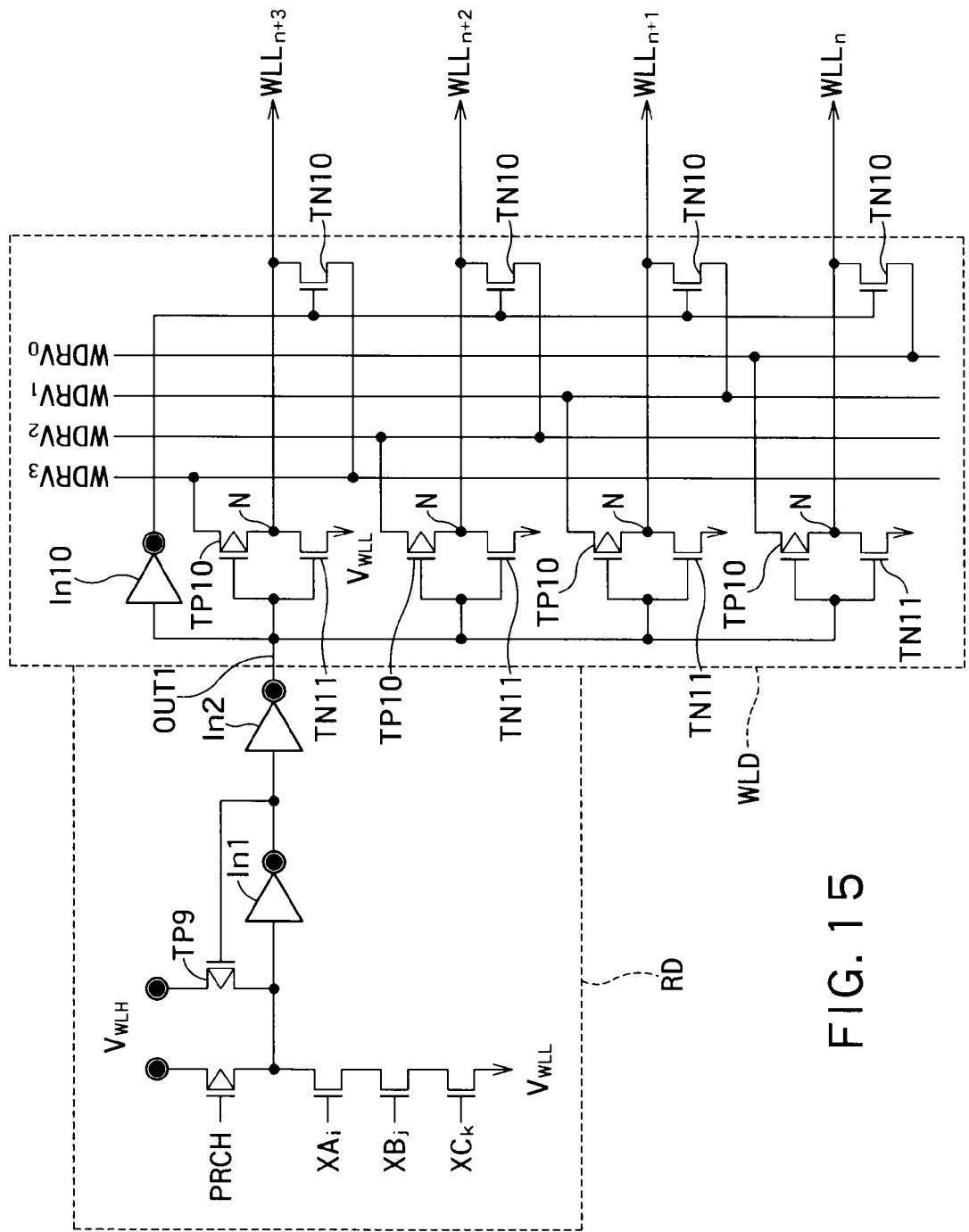
FIG. 15 is a circuit diagram showing a configuration of a row decoder RD and a WL driver WLD according to the third embodiment.

FIG. 15 is a circuit diagram showing a configuration of a row decoder RD and a WL driver WLD according to the third embodiment. In the second embodiment, the word line potential under the data holding state is VWLM and the potential of the second word line WLL1 during "0" purge is VWLL.

According to the third embodiment, the word line potential under the data holding state is VWLL and the potential of the second word line WLL1 during "1" write is VWLM. The source of an N-type transistor TN11 is connected to VWLL in the third embodiment.

Other configurations of the row decoder RD and the WL driver WLD in the third embodiment can be the same as those in the first embodiment. Other configurations of the row decoder RD and the WL driver WLD shown in FIG. 15 are based on the configuration shown in FIG. 6. Of course, other configurations of the row decoder RD and the WL driver WLD shown in FIG. 15 can be based on the configuration shown in FIG. 5. In this case, the inverter In10 is omitted and the gate of the transistor TN10 is connected to the node between the inverters In1 and In2.

Figure 16:
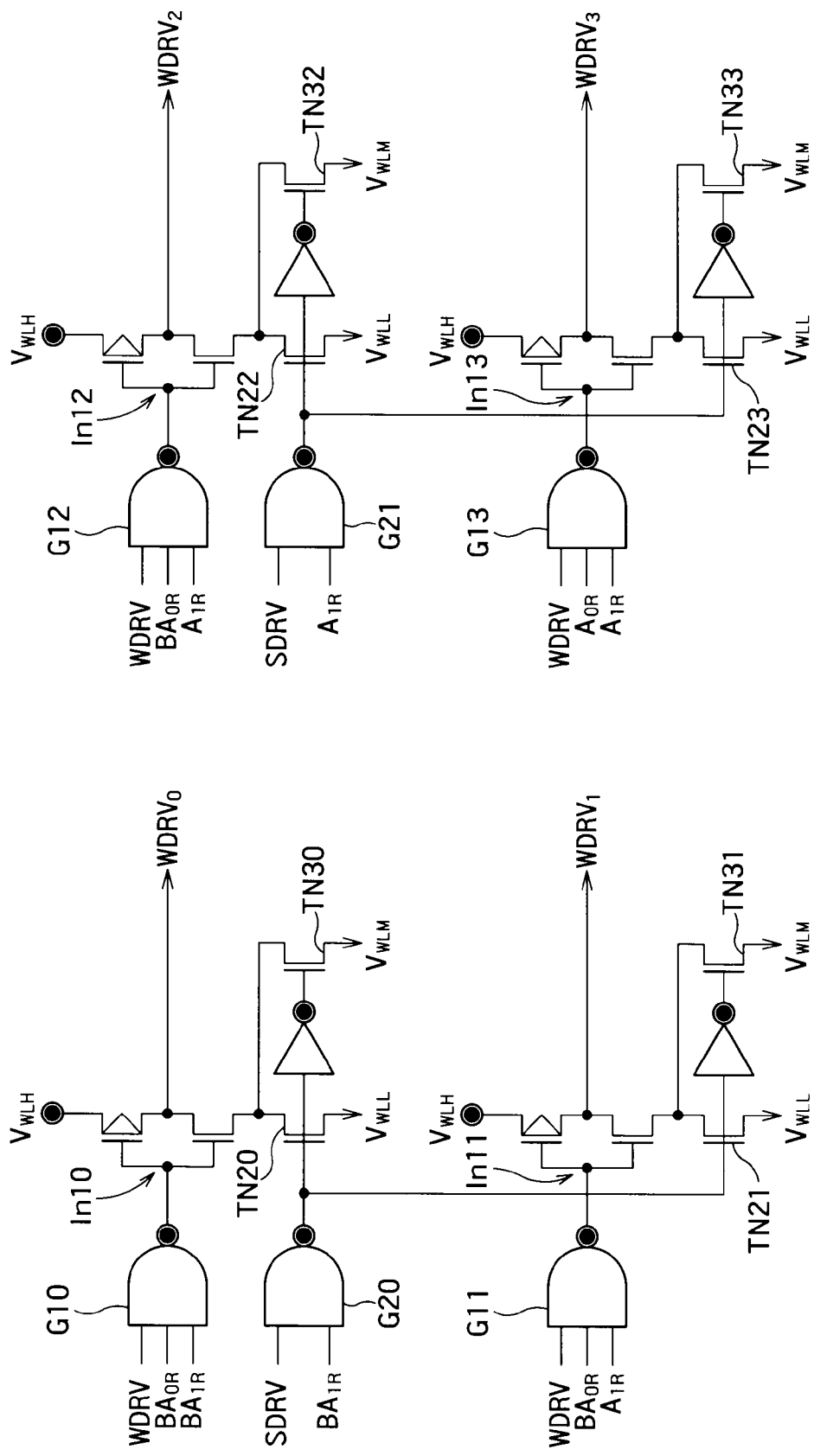
FIGS. 16A and 16B are circuit diagrams showing drive circuits for the word drive lines WDRV0 to WDRV3 in the third embodiment.

FIGS. 16A and 16B are circuit diagrams showing drive circuits for the word drive lines WDRV0 to WDRV3 in the third embodiment. The relation of connection between VWLM and VWLL in the third embodiment is opposite to the one between VWLM and VWLL in the first embodiment. The word line potential VWLL under the data holding state or the third word line WLL2, WLL3 is connected to the sources of the N-type transistors TN20 to TN23. The potential VWLM applied to the second word line WLL1 is connected to the sources of the N-type transistors TN30 to TN33. The control signal WDRV is activated during the data write operation (from t1 to t4) shown in FIG. 14. The control signal SDRV is activated during the "1" writes (from t3 to t4).

That is, during "0" purge, the high level potential VWLH is applied to the selected word line WLL0 and the first low level potential VWLL is applied to all unselected word lines WLL1 to WLL3.

During the "1" write, the high level potential VWLH is applied to the selected word line WLL0 and the second low level potential VWLM is applied to the unselected word line (second word line) WLL1 sharing the source with the selected word line. The first low level potential VWLL is applied to other unselected word lines (third word lines) WLL2 and WLL3.

It suffices that the drive circuits for the word drive lines WDRV0 to WDRV3 are configured to raise the potential of the second word line from the data holding potential VWLL to VWLM, and are not limited to the configurations shown in FIGS. 16A and 16B.

The SL driver SLD and the SL decoder SLDEC can be configured in the same manner as in the second embodiment. The relation of connection between the source drive signals SDRV and SDRVA shown in FIGS. 13A and 13B is interchanged in the SL decoder SLDEC of the third embodiment.

The third embodiment can achieve effects identical to those of the second embodiment.

Fourth Embodiment

Figure 17:
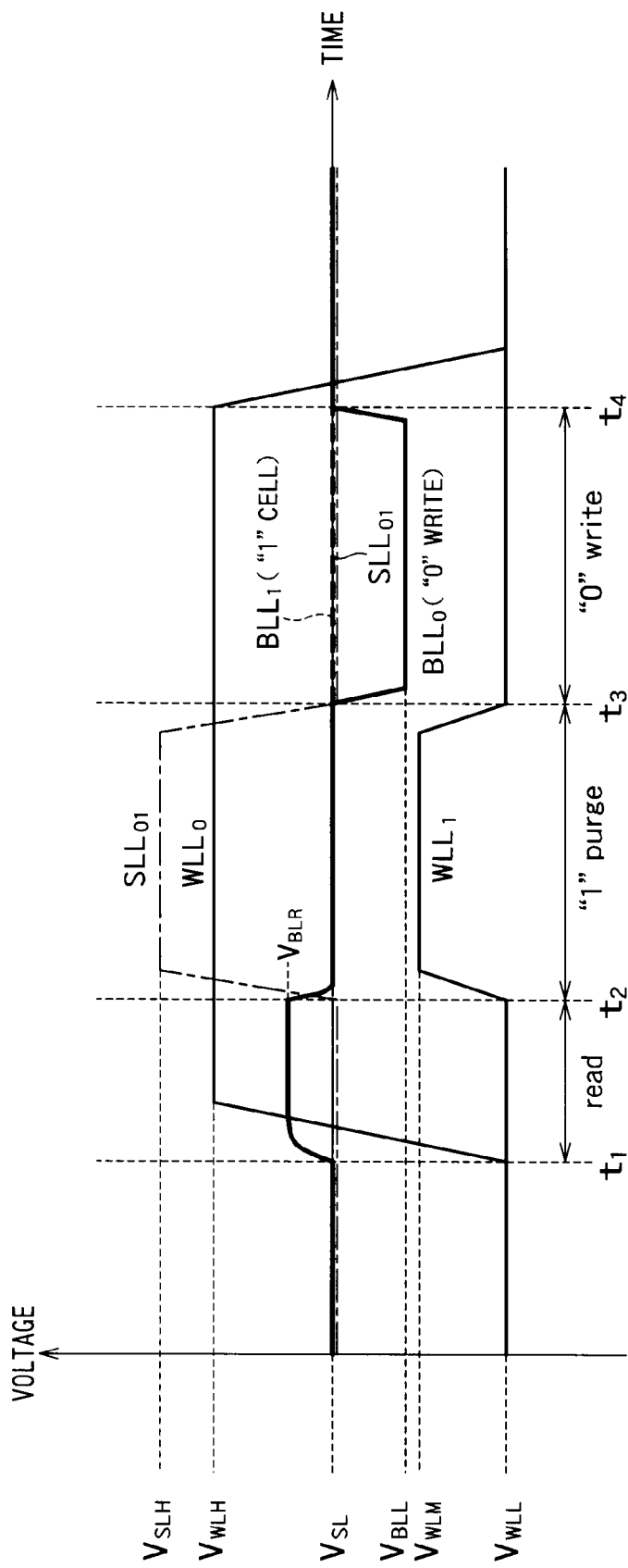
FIG. 17 is a timing diagram showing a data write operation of an FBC memory according to a fourth embodiment of the present invention.

FIG. 17 is a timing diagram showing a data write operation of an FBC memory according to a fourth embodiment of the present invention. A row decoder RD and a WL driver WLD according to the fourth embodiment can have the same configurations as those shown in FIG. 15. Drive circuits for the word drive lines WDRV0 to WDRV3 in the fourth embodiment have the same configurations as those of FIGS. 16A and 16B. An SL decoder SLDEC and an SL driver SLD in the fourth embodiment can be configured so that VSLL is changed to VSL and VSL is changed to VSLH in the configuration shown in FIG. 8 or 9. Drive circuits for the source drive lines SDRV0 and SDRV1 can be configured so that VSLL is changed to VSL and VSL is changed to VSLH in the configurations shown in FIGS. 10A and 10B.

In the drive circuits for the word drive lines WDRV0 to WDRV3 shown in FIGS. 16A and 16B, the control signal WDRV is activated during a data write operation (from t1 to t4) shown in FIG. 17. The control signal SDRV is activated during "1" purge (from t2 to t3).

The "1" purge is performed upon memory cells MC connected to the selected word line WLL0 in all columns and "0" write is then performed upon memory cells MC in a selected column in the fourth embodiment.

The voltage relation between the word line WL, the bit line BL, and the source line SL during the "1" purge is substantially the same as the one during the "1" write in the third embodiment. In the fourth embodiment, however, data "1" is written to memory cells MC in all columns. The voltages of all bit lines BL are thus set to the bit line voltage VSL under the data holding state.

The voltage relation between the word line WL, the bit line BL, and the source line SL during the "0" write is substantially the same as the one during the "0" purge in the third embodiment. Because data "0" is selectively written in the fourth embodiment, only the voltage of the bit line BLL0 in the selected column is set to the bit line voltage VBLL during the "0" write and the voltage of the source line SLL01 is set to the bit voltage VSL under the data holding state. The voltage of the bit line BLL1 in an unselected column is kept at the bit line voltage VSL under the data holding state.

The data holding state in the fourth embodiment is the same as the one in the third embodiment. That is, the word line potential under the data holding state is VWLL lower than VWLM in the fourth embodiment.

The selected source line SLL01 corresponding to the selected word line WLL0 is made to rise to the high level potential VSLH at t2. Impact ionization thus occurs between the bodies and the sources of all memory cells MC connected to the selected word line WLL0. As a result, data "1" is written in memory cells MC connected to the selected word line WLL0 in all columns.

In this case, the potential of the unselected word line (second word line) WLL1 sharing the source line SLL01 with the selected word line WLL0 is made to rise to the potential VWLM. Thus, "0" cells connected to the second word line WLL1 can avoid disturb caused by GIDL. The timing of making the potential of the second word line WLL1 rise to VWLM is preferably between the point when the potential of the selected source line SLL01 starts to rise and the point when the potential of the selected source line SLL01 reaches VSLH. That is, the point when the potential of the second word line WLL1 starts to rise is after the point when the potential of the selected source line SLL01 starts to rise and the point when the potential of the second word line WLL1 reaches VWLM is before the point when the potential of the selected source line SLL01 reaches VSLH. "1" cells connected to the second word line WLL1 can be prevented from being subject to disturb. Further, data "1" can be prevented from being written in "0" cells connected to the bit line BLL1 and the word line WLL1.

"0" write is performed from t3 to t4. The selected bit line BLL0 that the "0" write is performed is made to fall to VBLL lower than VSL. The bit line BLL1 in the unselected column is kept at the potential VSL under the data holding state. All source lines SL including the selected source line SLL01 are set to the potential VSL under the data holding state. A forward bias is thus applied between the body and the drain of a memory cell MC in the selected column and holes in the body are drawn to the drain. In this way, data "0" is selectively written.

The timing of returning the potential of the second word line WLL1 to VWLL is preferably between the point when the potential of the selected source line SLL01 starts to fall and the point when the potential of the bit line BLL0 reaches VBLL. "0" cells connected to the second word line WLL1 are prevented from being subject to disturb caused by GIDL. Further, it is possible to prevent the data "0" from being written in "1" cells connected to the bit line BLL1 and the word line WLL1.

Because the source line potential and the bit line potential are set to VSL in memory cells MC in the unselected column, "0" is not written.

When the potential of the second word line WLL1 is still VWLM, "1" cells connected to the second word line WLL1 and the bit line BLL0 in the selected column may be subject to disturb. To suppress such disturb, the WL driver WLD returns the voltage of the second word line WLL1 to the potential VWLL under the data holding state before the timing of making the selected bit line BLL0 fall to VBLL in the "0" write.

After the "0" write, the selected bit line BLL0 is returned to the potential VSL of the under the data holding state and the selected word line WLL0 is returned to the voltage VWLL under the data holding state at around t4.

The "1" purge is performed and then "0" is selectively written in the fourth embodiment. The potential relations between the word line, the source line, and the bit line in the various operations are the same as those in the third embodiment. Therefore, the fourth embodiment can achieve effects identical to those of the third embodiment.

Fifth Embodiment

Figure 18:
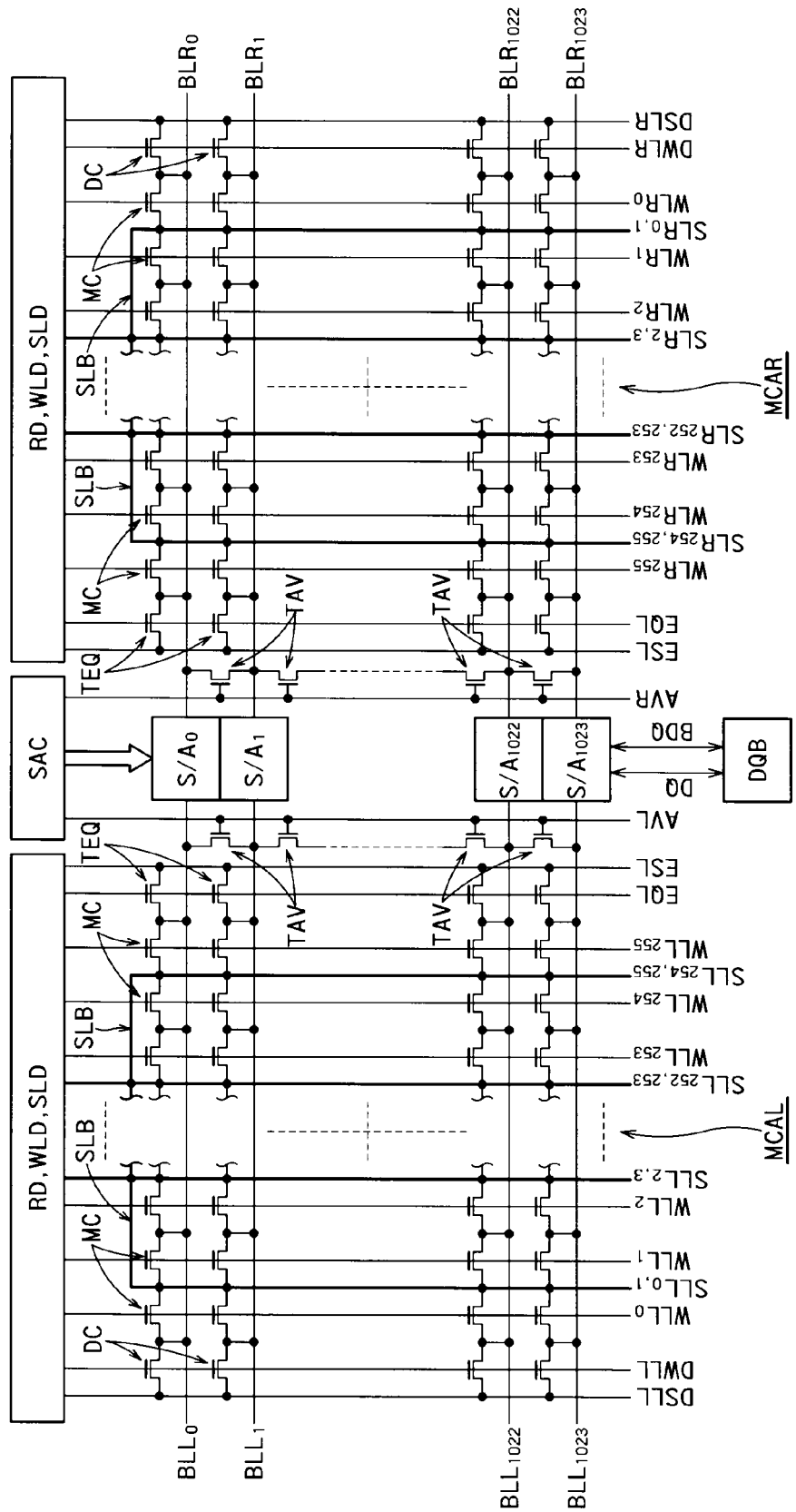
FIG. 18 shows a configuration of an FBC memory according to a fifth embodiment of the present invention.

FIG. 18 shows a configuration of an FBC memory according to a fifth embodiment of the present invention. In the fifth embodiment, an SL driver SLD is configured to control a plurality of source lines. For example, two source lines SL are connected in common to the SL driver SLD and the SL driver SLD drives the two source lines SL at the same time. A group of the source lines driven by the SL driver SLD is also called "source line block SLB".

The SL driver SLD drives the selected source line block SLB corresponding to a selected word line WLL0 like the selected source line SLL01 shown in, e.g., FIG. 4 in the fifth embodiment. The WL driver WLD needs to drive all unselected word lines corresponding to the selected source line block SLB like the unselected word line WLL1 shown in, e.g., FIG. 4. When the source line block SLB includes two source lines, four word lines correspond to one source line block. A group of word lines corresponding to a source line block SLB is also called "word line block WLB".

More specifically, when the selected word line WLL0 is selected, the selected source line block SLB includes source lines SLL01 and SLL23. The selected source line block SLB is thus selected and the source lines SLL01 and SLL23 are shifted to VSLL in "0" purge. To suppress disturb for "1" cells connected to the source lines SLL01 and SLL23, the WL driver WLD makes unselected word lines WLL1, WLL2, and WLL3 of the word line block WLB (WLL0, WLL1, WLL2, and WLL3) corresponding to the selected source line block SLB fall from the word line potential VWLM under the data holding state to VWLL.

The selected word line WLL0 is made to rise to the first high level voltage VWLH as in the first embodiment. Unselected word lines that do not correspond to the selected source line block SLB are kept at the word line voltage VWLM under the data holding state as in the first embodiment.

Figure 19:
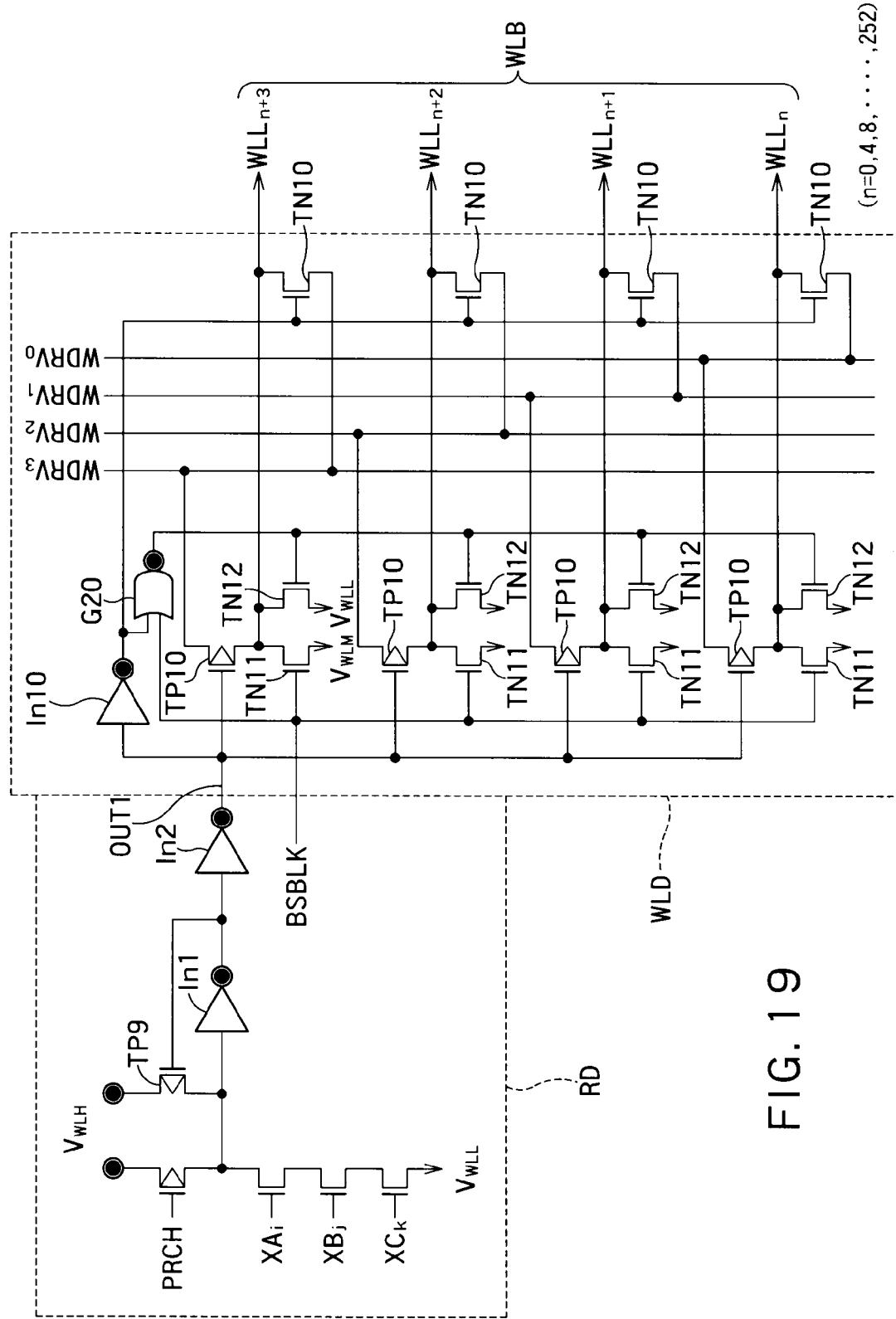
FIG. 19 is a circuit diagram showing a configuration of a row decoder RD and the WL driver WLD according to the fifth embodiment.

FIG. 19 is a circuit diagram showing a configuration of a row decoder RD and the WL driver WLD according to the fifth embodiment. The configuration of the row decoder RD according to the fifth embodiment can be the same as in the first embodiment. The WL driver WLD of the fifth embodiment is the WL driver WLD of the first embodiment to which a NOR gate G20 and N-type transistors TN12 are added.

The NOR gate G20 receives an inverted signal of the output OUT1 from the row decoder RD and a decoder signal BSBLK of a source line block. The output of the NOR gate G20 is connected to the gates of the transistors TN12. The transistor TN12 is connected between each of word lines WLLn to WLLn+3 and the first low level potential VWLL. The gate of the transistor TN11 receives the decoder signal BSBLK.

A decoder signal SBLK selects the source line block SLB. The decoder signal BSBLK is the inverted signal of the signal SBLK. When a source line block SLB is selected, the decoder signal BSBLK is activated to be logically low. When the source line block SLB is not selected, the decoder signal BSBLK is inactivated to be logically high. The WL driver WLD driving the word line block WLB corresponding to the selected source line block SLB receives logically low as the decoder signal BSBLK. The WL driver WLD driving a word line block WLB which does not correspond to the selected source line block SLB receives logically high as the decoder signal BSBLK. The WL driver WLD for the word line block WLB which does not correspond to the selected source line block SLB is set to VWLM through the transistor TN11. In this case, the output OUT1 of the row decoder RD is logically high and the transistors TN10, TP10, and TN12 are thus kept off.

The word line block WLB including the selected word line WLL0 among word line blocks WLB for the selected source line block SLB receives logically low as the output OUT1 of the row decoder RD and logically low as the decoder signal BSBLK. The transistors TN10 and TP10 are thus switched on and the transistors TN11 and TN12 are switched off. The selected word line WLL0 is connected via the transistor TP10 to the word drive line WDRV0. The voltage of the word drive line WDRV0 is controlled to be the high level voltage VWLH. Three other unselected word lines WLL1 to WLL3 in the word line block WLB including the selected word line WLL0 are connected via the transistors TN10 to the word drive lines WDRV1 to WDRV3. The voltages of the word drive lines WDRV1 to WDRV3 are controlled to be VWLL.

When a plurality of word line blocks WLB correspond to the selected source line block, a word line block WLB which does not include the selected word line and corresponds to the selected source line block SLB exists. Four word lines included in such word line block WLB need to be set to the voltage VWLL. In this case, the output OUT1 of the row decoder RD is logically high and the decoder signal BSBLK is logically low. Thus, the transistor TN12 is switched on and the transistors TP10, TN10, and TN11 are switched off.

Accordingly, the word line block WLB which corresponds to the selected source line block SLB but does not include the selected word line is set to the voltage VWLL.

FIGS. 20A to 20D are circuit diagrams showing drive circuits for the word drive lines WDRV0 to WDRV3 in the fifth embodiment. In the fifth embodiment, unselected word lines WLL1 to WLL3 other than the selected word line WLL0 in the word line block WLB corresponding to the selected source line block SLB are all set to the same voltage VWLM. Accordingly, the gates G20 and G21 shown in FIGS. 7A and 7B are unnecessary. The source drive signal SDRV is applied instead to gates of transistors TN30 to TN33. BSDRV which is an inverted signal of the source drive signal SDRV is applied to gates of transistors TN20 to TN23.

During the "0" purge (from t2 to t3 in FIG. 4), (WDRV, SDRV) is (1, 1). In this case, the transistors TN20 to TN23 are switched off and the transistors TN30 to TN33 are switched on. Three word drive lines WDRV1 to WDRV3 that are not selected by addresses A0R, A1R, BA0R, and BA1R are connected via the respective transistors TN31 to TN33 and the respective inverters In11 to In13 to the first low level voltage VWLL.

The word drive line WDRV0 selected by the addresses A0R, A1R, BA0R, and BA1R is connected via the inverter In10 to the high level voltage VWLH.

The WL driver WLD driving unselected word lines which do not correspond to the selected source line block SLB is set to VWLM through the transistor TN11 as described above. At this time, the word drive lines WDRV0 to WDRV3 are not used.

During the "1" write (from t3 to t4 in FIG. 4), (WDRV, SDRV) is (1, 0). In this case, the transistors TN20 to TN23 are switched on and the transistors TN30 to TN33 are switched off. The unselected word drive lines WDRV1 to WDRV3 thus have the second low potential VWLM. The second low potential VWLM is applied to the unselected word lines.

The word drive line WDRV0 selected by the addresses A0R, A1R, BA0R, and BA1R is connected via the inverter In10 to the high level voltage VWLH.

Under the data holding state, (WDRV, SDRV) is (0, 0). In this case, the transistors TN20 to TN23 are switched on and the transistors TN30 to TN33 are switched off. All word drive lines WDRV0 to WDRV3 have the second low potential VWLM regardless of the addresses A0R, A1R, BA0R, and BA1R and the second low potential VWLM is applied to all word lines.

Even if source line blocks SLB including a plurality of source lines are driven at the same time during "0" purge, the first low potential VWLL can be applied to unselected word lines corresponding to a selected source line block SLB in the fifth embodiment. The second low potential VWLM can be applied to the unselected word lines during "1" write.

The configurations of the SL decoder SLDEC and the SL driver SLD in the fifth embodiment can be the same as those in the first embodiment or the second embodiment.

Figure 20C:
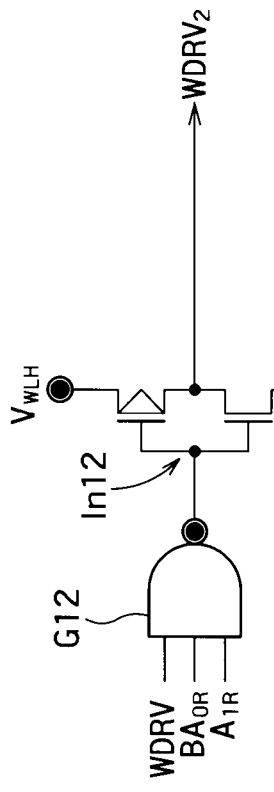
FIGS. 20A to 20D are circuit diagrams showing drive circuits for the word drive lines WDRV0 to WDRV3 in the fifth embodiment.
Figure 20D:
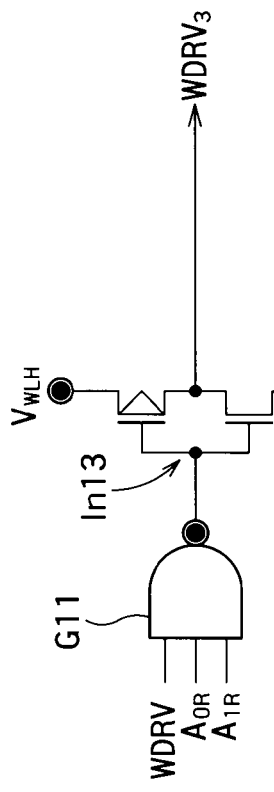
Figure 20A:
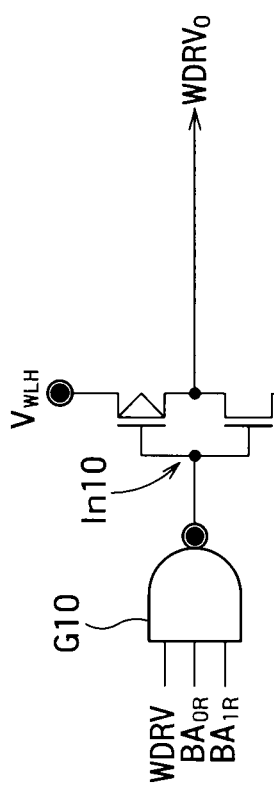
Figure 20B:
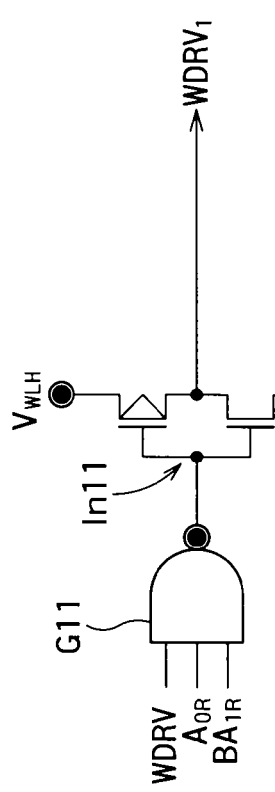

According to the fifth embodiment, the drive circuits for the word drive lines WDRV0 to WDRV3 shown in FIGS. 20A and 20B can be reduced as compared to other embodiments. Configurations of the drive circuits for the word drive lines WDRV0 to WDRV3 are not limited to those shown in FIGS. 20A and 20B. Because a plurality of source lines are driven at the same time, the circuit of the source line driver SLD can be reduced.

The fifth embodiment can perform the write operation in the second to fourth embodiments. For example, when the write operation shown in FIG. 11 is performed, operations of a selected word line and an unselected word line are the same as in the first embodiment shown in FIG. 4. Thus, the row decoder RD, the word line driver WLD, and the drive circuit for the word drive line in the fifth embodiment can be used.

When the write operation shown in FIG. 14 according to the third embodiment or FIG. 17 according to the fourth embodiment is performed in the fifth embodiment, the source of the transistor TN11 shown in FIG. 19 is connected to VWLL and the source of the transistor TN12 is connected to VWLM. Further, the sources of the transistors TN20 to TN23 shown in FIGS. 20A to 20D are connected to VWLL and the sources of the transistors TN30 to TN33 are connected to VWLM. When the fifth embodiment performs the write operation shown in FIG. 14, the source line drive signal SDRV is activated during the "1" write. When the fifth embodiment performs the write operation shown in FIG. 17, the source line drive signal SDRV is activated during the "1" purge.

Therefore, the firth embodiment can also achieve the effects of the first to fourth embodiments.

The memory cell MC can be constituted by a P-type FET instead of an N-type FET in the first to fifth embodiments. In this case, the voltage relation between the word line WL, the bit line BL, and the source line SL is reversed with respect to the ground potential. The magnitude relation of absolute values of voltage between the word line WL, the bit line BL, and the source line SL is the same as in the above description.

With reference to FIGS. 15 and 19, inputs to the gate of the transistor TN10 and the NOR gate G20 can be connected to the node between the inverters In1 and In2 as shown in FIG. 5.

While the SL decoder SLDEC of the above embodiments is provided for two source lines, the SL decoder SLDEC can be provided for one source line. In this case, it suffices that the SL driver SLD comprises one source drive line SDRV and the corresponding transistor and inverter.

In the above embodiments, activation means switching on or driving devices or circuits and inactivation means switching off or stopping devices or circuits. Accordingly, HIGH (high potential level) signals can be activated signals or LOW (low potential level) signals can be activated signals. For example, NMOS transistors are activated by making the gates HIGH. On the other hand, PMOS transistors are activated by making the gates LOW.

The invention claimed is:

1. A semiconductor memory device comprising:
   a plurality of bit lines;
   a plurality of word lines crossing the bit lines;
   a plurality of memory cells corresponding to intersections of the bit lines with the word lines, the memory cells being configured to store data depending on carriers stored in electrically floating bodies;
   a source line corresponding to first and second word lines adjacent to each other and connected to memory cells connected to the first and the second word lines;
   a plurality of sense amplifiers connected to the bit lines and configured to detect data stored in the memory cells or to write data in the memory cells;
   a source line driver configured to drive the source line; and
   a word line driver configured to drive the first word line or the second word line, wherein
   during a first write operation in which first logical data is written in all memory cells connected to the first word line, the word line driver applies a voltage to the first word line in such a manner that channels are formed in the memory cells connected to the first word line, the source line driver shifts a voltage of a selected source line corresponding to the first word line in a direction away from the voltage of the first word line, and the word line driver shifts a voltage of the second word line in a same direction as a transition direction of voltage of the selected source line, and
   during a second write operation in which second logical data is written in a selected memory cell of the memory cells connected to the first word line, the source line driver and the word line driver respectively shift voltages of the selected source line and the second word line in a direction approaching the voltage of the first word line.

2. The device of claim 1, wherein one of the sense amplifiers shifts a voltage of a bit line connected to the selected memory cell in a direction approaching the voltage of the first word line in the second write operation.

3. The device of claim 1, wherein the source line driver shifts the voltage of the selected source line to a larger extent than an absolute value of voltage of the first word line while keeping the voltage of the bit line connected to the selected memory cell at a bit line potential under a data holding state in the second write operation.

4. The device of claim 1, wherein the source line driver and the word line driver return the voltages of the selected source line and the second word line to the voltage of the source line under the data holding state and the voltage of the word line under the data holding state, respectively in the second write operation.

5. The device of claim 2, wherein the source line driver and the word line driver return the voltages of the selected source line and the second word line to the voltage of the source line under the data holding state and the voltage of the word line under the data holding state, respectively in the second write operation.

6. The device of claim 3, wherein the source line driver and the word line driver return the voltages of the selected source line and the second word line to the voltage of the source line under the data holding state and the voltage of the word line under the data holding state, respectively in the second write operation.

7. The device of claim 1, wherein
   unselected word lines other than the first and the second word lines are kept at the word line potential under the data holding state, and
   the source lines other than the selected source line are kept at the source line potential under the data holding state.

8. The device of claim 2, wherein
   unselected word lines other than the first and the second word lines are kept at the word line potential under the data holding state, and
   the source lines other than the selected source line are kept at the source line potential under the data holding state.

9. The device of claim 3, wherein
   unselected word lines other than the first and the second word lines are kept at the word line potential under the data holding state, and
   the source lines other than the selected source line are kept at the source line potential under the data holding state.

10. A semiconductor memory device comprising:
    a plurality of bit lines;
    a plurality of word lines crossing the bit lines;
    a plurality of memory cells corresponding to intersections of the bit lines with the word lines, the memory cells being configured to store data depending on carriers stored in electrically floating bodies;
    a source line corresponding to first and second word lines adjacent to each other and connected to memory cells connected to the first and the second word lines;

a plurality of sense amplifiers connected to the bit lines and configured to detect data stored in the memory cells or to write data in the memory cells;

a source line driver configured to drive the source line; and a word line driver configured to drive the first word line or the second word line, wherein during a first write operation of writing first logical data in all memory cells connected to the first word line, the word line driver applies a voltage to the first word line in such a manner that channels are formed in the memory cells connected to the first word line, the source line driver shifts the voltage of the selected source line corresponding to the first word line in a direction opposite to a transition direction of voltage of the first word line, while the word line driver keeps the voltage of the second word line at the word line potential under the data holding state, and during a second write operation in which second logical data is written in a selected memory cell of the memory cells connected to the first word line, the source line driver and the word line driver respectively shift voltages of the selected source line and the second word line in a direction approaching the voltage of the first word line.

11. The device of claim 10, wherein the voltages of the selected source line and the bit line are set to be substantially equal to each other in the first write operation.

12. A semiconductor memory device comprising:

a plurality of bit lines;

a plurality of word lines crossing the bit lines;

a plurality of memory cells corresponding to intersections of the bit lines with the word lines, the memory cells being configured to store data depending on carriers stored in electrically floating bodies;

a source line corresponding to first and second word lines adjacent to each other and connected to memory cells connected to the first and the second word lines;

a plurality of sense amplifiers connected to the bit lines and configured to detect data stored in the memory cells or to write data in the memory cells; and a source line driver configured to drive the source line; and a word line driver configured to drive the first word line or the second word line, wherein during a first write operation in which first logical data is written in all memory cells connected to the first word line, the word line driver applies a voltage to the first word line in such a manner that channels are formed in the memory cells connected to the first word line, the source line driver and the word line driver respectively shift a voltage of a selected source line corresponding to the first word line and a voltage of the second word line in a direction approaching the voltage of the first word line, and during a second write operation in which second logical data is written in a selected memory cell of the memory cells connected to the first word line, the word line driver shifts voltages of the second word line in a direction away from the voltage of the first word line, and the source line driver shifts a voltage of the selected source line in a same direction as a transition direction of voltage of the second word line.

13. The device of claim 12, wherein the source line driver and the word line driver return the voltages of the selected source line and the second word line to the voltage of the source line under the data holding state and the voltage of the word line under the data holding state, respectively in the second write operation.

14. The device of claim 1, wherein the source line driver drives a plurality of the source lines at the same time.

15. The device of claim 10, wherein the source line driver drives a plurality of the source lines at the same time.

16. The device of claim 12, wherein the source line driver drives a plurality of the source lines at the same time.

17. The device of claim 14, wherein the word line driver shifts voltages of a plurality of the second word lines corresponding to the selected source lines in a direction approaching the voltage of the first word line in the second write operation.

18. The device of claim 15, wherein the word line driver shifts voltages of a plurality of the second word lines corresponding to the selected source lines in a direction approaching the voltage of the first word line in the second write operation.

19. The device of claim 16, wherein the word line driver shifts voltages of a plurality of the second word lines corresponding to the selected source lines in a direction approaching the voltage of the first word line in the second write operation.

* * * * *